(12) United States Patent
Funahashi

(10) Patent No.: US 7,732,704 B2
(45) Date of Patent: *Jun. 8, 2010

(54) CONDUCTIVE PASTE FOR CONNECTING THERMOELECTRIC CONVERSION MATERIAL

(75) Inventor: Ryoji Funahashi, Ikeda (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 104 days.

This patent is subject to a terminal disclaimer.

(21) Appl. No.: 10/574,844

(22) PCT Filed: Sep. 29, 2004

(86) PCT No.: PCT/JP2004/014680

§ 371 (c)(1), (2), (4) Date: Apr. 6, 2006

(87) PCT Pub. No.: WO2005/036661

PCT Pub. Date: Apr. 21, 2005

(65) Prior Publication Data

US 2007/0125412 A1  Jun. 7, 2007

(30) Foreign Application Priority Data

Oct. 8, 2003 (JP) ............................. 2003-348913

(51) Int. Cl.
H01L 35/12 (2006.01)
H01L 37/00 (2006.01)
H01L 35/16 (2006.01)
H01L 35/20 (2006.01)

(52) U.S. Cl. ................. 136/236.1; 136/200; 136/238; 136/239; 136/240; 136/241

(58) Field of Classification Search .................. None
See application file for complete search history.

(56) References Cited

U.S. PATENT DOCUMENTS 4,859,250 A * 8/1989 Buist ........................... 136/225
5,352,299 A * 10/1994 Yoshimoto et al. ............ 136/201
5,422,190 A * 6/1995 Alexander ..................... 428/552
6,376,763 B2 * 4/2002 Funahashi et al. ............. 136/201
2002/0157699 A1 10/2002 Ichinose et al.

FOREIGN PATENT DOCUMENTS

EP 1 123 902 A1 8/2001

(Continued)

OTHER PUBLICATIONS

Funahashi, R., S. Urata, K. Mizuno, T. Kouuchi, and M. Mikami. "Ca2.7Bi0.3Co4O9/La0.9Bi0.1NiO3 Thermoelectric Devices with High Output Power Density." Applied Physics Letters 85.6 (2004): 1036-038.*

(Continued)

Primary Examiner—Nam X Nguyen
Assistant Examiner—Kourtney R Salzman
(74) Attorney, Agent, or Firm—Westerman, Hattori, Daniels & Adrian, LLP

(57) ABSTRACT

The present invention provides an electrically conductive paste for connecting thermoelectric materials, the paste comprising a specific powdery oxide and at least one powdery electrically conductive metal selected from the group consisting of gold, silver, platinum, and alloys containing at least one of these metals. By connecting a thermoelectric material to an electrically conductive substrate with the electrically conductive paste of the invention, a suitable electroconductivity is imparted to the connecting portion of the thermoelectric element. Further, the thermal expansion coefficient of the connecting portion can be made close to that of the thermoelectric material. Therefore, even when high-temperature power generation is repeated, separation at the connecting portion is prevented and a favorable thermoelectric performance can be maintained.

4 Claims, 5 Drawing Sheets

FOREIGN PATENT DOCUMENTS

| | | |
|---|---|---|
| EP | 1 174 933 A2 | 1/2002 |
| EP | 1 174 933 A3 | 5/2006 |
| JP | 63-172478 A | 7/1988 |
| JP | 11-68172 A | 3/1999 |
| JP | 11-233833 A | 8/1999 |
| JP | 2002-232023 A | 8/2002 |
| JP | 2003-197982 A | 7/2003 |
| JP | 2003-306381 * | 10/2003 |
| WO | WO 03/081686 A1 | 10/2003 |
| WO | WO 03081686 A1 * | 10/2003 |

OTHER PUBLICATIONS

Xu, Gaojie, Ryoji Funahashi, Masahiro Shikano, Qirong Pu, and Biao Liu. "High Temperature Transport Properties of Ca3-xNaxCo4O9." Solid State Communications 124 (2002): 73-76.*

R. Funahashi et al., Jpn. J. Appl. Phys. vol. 39 (2000), pp. L 1127-L 1129.

PCT International Search Report, dated Dec. 28, 2004, issued in corresponding International Application No. PCT/JP2004/014680.

Supplementary European Search Report dated Dec. 14, 2007, issued in corresponding European patent application No. 04773613.7.

R. Funahashi et al., "$Ca_{2.7}Bi_{0.3}Co_4O_9/La_{0.9}Bi_{0.1}iNiO_3$ thermoelectric devices with high output power density", Applied Physics Letters, vol. 85, No. 6, pp. 1036-1038, Aug. 9, 2004.

R. Funahashi et al.: "Thermoelectric properties of Ln-Ni-O (Ln: lanthanoid) systems", $22^{nd}$ International Conference on Thermoelectics, pp. 184-187, 2003.

Gaojie Xu et al., "High temperature transport properties of $Ca_3xNa_xCo_4O_9$ system", Solid State Communications, vol. 124, No. 3, pp. 73-76.

Ichiro Matsubara et al., "Fabrication of an all-oxide thermoelectric power generator", Applied Physics Letters, vol. 78, No. 23, pp. 3627-3629.

Japanese Office Action mailed on Feb. 9, 20010, issued in corresponding Japanese Patent Application No. 2005-514574.

* cited by examiner

CONDUCTIVE PASTE FOR CONNECTING THERMOELECTRIC CONVERSION MATERIAL

TECHNICAL FIELD

The present invention relates to an electrically conductive paste for connecting thermoelectric materials, a thermoelectric element obtained using the paste, and a thermoelectric module.

BACKGROUND OF THE INVENTION

In Japan, only 30% of the primary energy supply is used as effective energy, with about 70% being eventually lost to the atmosphere as heat. The heat generated by combustion in industrial plants, garbage-incineration facilities or the like is lost to the atmosphere without conversion into other energy. In this way, a vast amount of thermal energy is wastefully discarded, while acquiring only a small amount of energy by combustion of fossil fuels or other means.

To increase the proportion of energy to be utilized, the thermal energy currently lost to the atmosphere should be effectively used. For this purpose, thermoelectric conversion, which directly converts thermal energy to electrical energy, is an effective means. Such a thermoelectric conversion utilizes the Seebeck effect, and is an energy conversion method for generating electricity in which a difference in electric potential is caused by creating a difference in the temperature between both ends of a thermoelectric material.

In such a method for generating electricity utilizing thermoelectric conversion, i.e., thermoelectric generation, electricity is generated simply by setting one end of a thermoelectric material at a location heated to a high temperature by waste heat, and the other end in the atmosphere (room temperature) and connecting conductive wires to both ends. This method entirely eliminates the need for moving parts such as the motors or turbines generally required for electric power generation. As a consequence, the method is economical and can be carried out without generating gases by combustion. Moreover, the method can continuously generate electricity until the thermoelectric material has deteriorated. Furthermore, thermoelectric generation enables electric power generation at a high power density. Therefore, it is possible to make electric power generators (modules) small and light enough to use them as mobile power supplies for cellular phones, notebook computers, etc.

Therefore, thermoelectric generation is expected to play a role in the resolution of future energy problems. To realize thermoelectric generation, a thermoelectric module comprising thermoelectric materials that have both a high thermoelectric conversion efficiency and excellent properties in terms of heat resistance, chemical durability, etc., will be required.

$CoO_2$-based layered oxides such as $Ca_3Co_4O_9$ have been reported as substances that achieve excellent thermoelectric performance in air at high temperatures, and such thermoelectric materials are currently being developed (see R. Funahashi et al., Jpn. J. Appl. Phys., 39, L1127 (2000), for example).

The realization of efficient thermoelectric generation using such thermoelectric materials requires a thermoelectric element comprising a pair of connected p- and n-type thermoelectric materials, and a thermoelectric module obtained by integrating thermoelectric elements, i.e., an electric power generator. However, the development of thermoelectric elements and thermoelectric modules has been delayed so far as compared to the development of thermoelectric materials.

In particular, the development of a method for connecting thermoelectric materials with a low electrical resistance is important for putting thermoelectric modules into practical use. In the case of thermoelectric generation using high-temperature waste heat of 673 K (400° C.) or higher, thermoelectric materials are connected using, as a binder, a paste containing a noble metal such as silver, gold, or platinum because a connecting portion formed by soldering is likely to oxidize or melt under such conditions. However, such noble metal pastes are not suitable when oxides are used as substrate materials, thermoelectric material, etc. because there is a large difference in the thermal expansion coefficient between the oxide and the noble metal contained in the paste. Thus, repeated high-temperature power generations cause separation at the connecting portion, resulting in increased internal resistance and lowered mechanical strength. The connecting portion therebetween also has a problem of a large interface resistance due to contact between the metal and oxide.

SUMMARY OF THE INVENTION

The present invention has been made to solve the above problems. A principal object of the invention is to provide a material for connecting thermoelectric materials which can achieve the connection of the thermoelectric material made of oxide with a low electrical resistance and which hardly arises a performance deterioration of a thermoelectric module even when repeating high-temperature power generation and further to provide a thermoelectric element produced using such a material for connecting thermoelectric materials.

The present inventors conducted extensive research to achieve the above object, and found that when an electrically conductive paste containing a noble metal powder and a specific complex oxide is used for connecting thermoelectric materials, an optimum electrical conductivity is given to the connecting portion of the thermoelectric material and the separation at the connecting portion can be prevented even when repeating high-temperature power generation. Thus, a good thermoelectric performance can be maintained over a long period of time. The present invention has been accomplished based on these findings.

More specifically, the present invention provides the following electrically conductive pastes for connecting thermoelectric materials, thermoelectric elements, thermoelectric modules, and thermoelectric conversion methods.

Item 1. An electrically conductive paste for connecting thermo electric materials comprising:

(i) at least one powdery oxide selected from the group consisting of complex oxides (a) to (d):

(a) a complex oxide represented by the formula $Ca_aA^1_bCo_cA^2_dO_e$ wherein $A^1$ is one or more elements selected from the group consisting of Na, K, Li, Ti, V, Cr, Mn, Fe, Ni, Cu, Zn, Pb, Sr, Ba, Al, Bi, Y, and lanthanoids; $A^2$ is one or more elements selected from the group consisting of Ti, V, Cr, Mn, Fe, Ni, Cu, Mo, W, Nb, and Ta; $2.2 \leq a \leq 3.6$; $0 \leq b \leq 0.8$; $2 \leq c \leq 4.5$; $0 \leq d \leq 2$; and $8 \leq e \leq 10$;

(b) a complex oxide represented by the formula $Bi_fPb_gM^1_hCo_iM^2_jO_k$ wherein $M^1$ is one or more elements selected from the group consisting of Na, K, Li, Ti, V, Cr, Mn, Fe, Ni, Cu, Zn, Pb, Ca, Sr, Ba, Al, Y, and lanthanoids; $M^2$ is one or more elements selected from the group consisting of Ti, V, Cr, Mn, Fe, Ni, Cu, Mo, W, Nb, and Ta; $1.8 \leq f \leq 2.2$; $0 \leq g \leq 0.4$; $1.8 \leq h \leq 2.2$; $1.6 \leq i \leq 2.2$; $0 \leq j \leq 0.5$; and $8 \leq k \leq 10$;

(c) a complex oxide represented by the formula $Ln_mR^1_nNi_pR^2_qO_r$ wherein Ln is one or more elements selected from the group consisting of lanthanoids; $R^1$ is one or more elements selected from the group consisting of Na, K, Sr, Ca, and Bi; $R^2$ is one or more elements selected from the group consisting of Ti, V, Cr, Mn, Fe, Ni, Cu, Mo, W, Nb, and Ta; $0.5 \leq m \leq 1.2$; $0 \leq n \leq 0.5$; $0.5 \leq p \leq 1.2$; $0 \leq q \leq 0.5$; and $2.7 \leq r \leq 3.3$;

(d) a complex oxide represented by the formula $(Ln_s R^3_t)_2 Ni_u R^4_v O_w$ wherein Ln is one or more elements selected from the group consisting of lanthanoids; $R^3$ is one or more elements selected from the group consisting of Na, K, Sr, Ca, and Bi; $R^4$ is one or more elements selected from the group consisting of Ti, V, Cr, Mn, Fe, Ni, Cu, Mo, W, Nb, and Ta; $0.5 \leq s \leq 1.2$; $0 \leq t \leq 0.5$; $0.5 \leq u \leq 1.2$; $0 \leq v \leq 0.5$; and $3.6 \leq r \leq 4.4$; and (ii) at least one powdery electrically conductive metal selected from the group consisting of gold, silver, platinum, and alloys containing at least one of these metals.

Item 2. The electrically conductive paste for connecting thermoelectric materials according to Item 1, wherein the powdery oxide mentioned in (i) above is contained in an amount of 0.5 to 20 parts by weight per 100 parts by weight of the powdery electrically conductive metal mentioned in (ii) above.

Item 3. The electrically conductive paste for connecting thermoelectric materials according to Item 1, further comprising a glass ingredient and a resin ingredient.

Item 4. An electrically conductive paste for connecting a p-type thermoelectric material comprising:

(i) at least one powdery oxide selected from the group consisting of:

a complex oxide represented by the formula $Ca_a A^1_b Co_c A^2_d O_e$ wherein $A^1$ is one or more elements selected from the group consisting of Na, K, Li, Ti, V, Cr, Mn, Fe, Ni, Cu, Zn, Pb, Sr, Ba, Al, Bi, Y, and lanthanoids; $A^2$ is one or more elements selected from the group consisting of Ti, V, Cr, Mn, Fe, Ni, Cu, Mo, W, Nb, and Ta; $2.2 \leq a \leq 3.6$; $0 \leq b \leq 0.8$; $2 \leq c \leq 4.5$; $0 \leq d \leq 2$; and $8 \leq e \leq 10$; and a complex oxide represented by the formula $Bi_f Pb_g M^1_h Co_i M^2_j O_k$ wherein $M^1$ is one or more elements selected from the group consisting of Na, K, Li, Ti, V, Cr, Mn, Fe, Ni, Cu, Zn, Pb, Ca, Sr, Ba, Al, Y, and lanthanoids; $M^2$ is one or more elements selected from the group consisting of Ti, V, Cr, Mn, Fe, Ni, Cu, Mo, W, Nb, and Ta; $1.8 \leq f \leq 2.2$; $0 \leq g \leq 0.4$; $1.8 \leq h \leq 2.2$; $1.6 \leq i \leq 2.2$; $0 \leq j \leq 0.5$; and $8 \leq k \leq 10$; and (ii) at least one powdery electrically conductive metal selected from the group consisting of gold, silver, platinum, and alloys containing at least one of these metals.

Item 5. The electrically conductive paste for connecting a p-type thermoelectric material according to Item 4, wherein the powdery oxide is at least one member selected from the group consisting of:

a complex oxide represented by the formula $Ca_a A^1_b Co_4 O_e$ wherein $A^1$ is one or more elements selected from the group consisting of Na, K, Li, Ti, V, Cr, Mn, Fe, Ni, Cu, Zn, Pb, Sr, Ba, Al, Bi, Y, and lanthanoids; $2.2 \leq a \leq 3.6$; $0 \leq b \leq 0.8$; and $8 \leq e \leq 10$; and a complex oxide represented by the formula $Bi_f Pb_g M^1_h Co_2 O_k$ wherein $M^1$ is one or more elements selected from the group consisting of Sr, Ca, and Ba; $1.8 \leq f \leq 2.2$; $0 \leq g \leq 0.4$; $1.8 \leq h \leq 2.2$; and $8 \leq k \leq 10$.

Item 6. The electrically conductive paste for connecting a p-type thermoelectric material according to Item 4, wherein the powdery oxide mentioned in (i) above is contained in an amount of 0.5 to 20 parts by weight of the powdery electrically conductive metal mentioned in (ii) above.

Item 7. The electrically conductive paste for connecting a p-type thermoelectric material according to Item 4, further comprising a glass ingredient and a resin ingredient.

Item 8. An electrically conductive paste for connecting an n-type thermoelectric material comprising:

(i) at least one powdery oxide selected from the group consisting of:

a complex oxide represented by the formula $Ln_m R^1_n Ni_p R^2_q O_r$ wherein Ln is one or more elements selected from the group consisting of lanthanoids; $R^1$ is one or more elements selected from the group consisting of Na, K, Sr, Ca, and Bi; $R^2$ is one or more elements selected from the group consisting of Ti, V, Cr, Mn, Fe, Ni, Cu, Mo, W, Nb, and Ta; $0.5 \leq m \leq 1.2$; $0 \leq n \leq 0.5$; $0.5 \leq p \leq 1.2$; $0 \leq q \leq 0.5$; and $2.7 \leq r \leq 3.3$; and a complex oxide represented by the formula $(Ln_s R^3_t)_2 Ni_u R^4_v O_w$ wherein Ln is one or more elements selected from the group consisting of lanthanoids; $R^3$ is one or more elements selected from the group consisting of Na, K, Sr, Ca, and Bi; $R^4$ is one or more elements selected from the group consisting of Ti, V, Cr, Mn, Fe, Ni, Cu, Mo, W, Nb, and Ta; $0.5 \leq s \leq 1.2$; $0 \leq t \leq 0.5$; $0.5 \leq u \leq 1.2$; $0 \leq v \leq 0.5$; and $3.6 \leq r \leq 4.4$; and (ii) at least one powdery electrically conductive metal selected from the group consisting of gold, silver, platinum, and alloys containing at least one of these metals.

Item 9. The electrically conductive paste for connecting an n-type thermoelectric material according to Item 8, wherein the powdery oxide is at least one member selected from the group consisting of:

a complex oxide represented by the formula $La_m R^1_n NiO_r$ wherein $R^1$ is one or more elements selected from the group consisting of Na, K, Sr, Ca, and Bi; $0.5 \leq m \leq 1.2$; $0 \leq n \leq 0.5$; and $2.7 \leq r \leq 3.3$; and a complex oxide represented by the formula $(La_s R^3_t)_2 NiO_w$ wherein $R^3$ is one or more elements selected from the group consisting of Na, K, Sr, Ca, and Bi; $0.5 \leq s \leq 1.2$; $0 \leq t \leq 0.5$; and $3.6 \leq w \leq 4.4$.

Item 10. The electrically conductive paste for connecting an n-type thermoelectric material according to Item 8, wherein the powdery oxide mentioned in (i) above is contained in an amount of 0.5 to 20 parts by weight per 100 parts by weight of the powdery electrically conductive metal mentioned in (ii) above.

Item 11. The electrically conductive paste for connecting an n-type thermoelectric material according to Item 8, further comprising a glass ingredient and a resin ingredient.

Item 12. A thermoelectric element wherein one end of a p-type thermoelectric material and one end of an n-type thermoelectric material are each connected to an electrically conductive substrate with an electrically conductive paste, the p-type thermoelectric material comprising:

a complex oxide represented by the formula $Ca_a A^1_b Co_c A^2_d O_e$ wherein $A^1$ is one or more elements selected from the group consisting of Na, K, Li, Ti, V, Cr, Mn, Fe, Ni, Cu, Zn, Pb, Sr, Ba, Al, Bi, Y, and lanthanoids; $A^2$ is one or more elements selected from the group consisting of Ti, V, Cr, Mn, Fe, Ni, Cu, Mo, W, Nb, and Ta; $2.2 \leq a \leq 3.6$; $0 \leq b \leq 0.8$; $2 \leq c \leq 4.5$; $0 \leq d \leq 2$; and $8 \leq e \leq 10$; or a complex oxide represented by the formula $Bi_f Pb_g M^1_h Co_i M^2_j O_k$ wherein $M^1$ is one or more elements selected from the group consisting of Na, K, Li, Ti, V, Cr, Mn, Fe, Ni, Cu, Zn, Pb, Ca, Sr, Ba, Al, Y, and lanthanoids; $M^2$ is one or more elements selected from the group consisting of Ti, V, Cr, Mn, Fe, Ni, Cu, Mo, W, Nb, and Ta; $1.8 \leq f \leq 2.2$; $0 \leq g \leq 0.4$; $1.8 \leq h \leq 2.2$; $1.6 \leq i \leq 2.2$; $0 \leq j \leq 0.5$; and $8 \leq k \leq 10$;

the n-type thermoelectric material comprising:

a complex oxide represented by the formula $Ln_mR^1_nNi_pR^2_qO_r$ wherein Ln is one or more elements selected from the group consisting of lanthanoids; $R^1$ is one or more elements selected from the group consisting of Na, K, Sr, Ca, and Bi; $R^2$ is one or more elements selected from the group consisting of Ti, V, Cr, Mn, Fe, Ni, Cu, Mo, W, Nb, and Ta; $0.5 \leq m \leq 1.2$; $0 \leq n \leq 0.5$; $0.5 \leq p \leq 1.2$; $0 \leq q \leq 0.5$; and $2.7 \leq r \leq 3.3$; or a complex oxide represented by the formula $(Ln_sR^3_t)_2Ni_uR^4_vO_w$ wherein Ln is one or more elements selected from the group consisting of lanthanoids; $R^3$ is one or more elements selected from the group consisting of Na, K, Sr, Ca, and Bi; $R^4$ is one or more elements selected from the group consisting of Ti, V, Cr, Mn, Fe, Ni, Cu, Mo, W, Nb, and Ta; $0.5 \leq s \leq 1.2$; $0 \leq t \leq 0.5$; $0.5 \leq u \leq 1.2$; $0 \leq v \leq 0.5$; and $3.6 \leq r \leq 4.4$; and the p-type thermoelectric material and the n-type thermoelectric material being each connected to the electrically conductive substrate with the electrically conductive paste of Item 1.

Item 13. A thermoelectric element wherein one end of a p-type thermoelectric material and one end of an n-type thermoelectric material are each connected to an electrically conductive substrate with an electrically conductive paste, the p-type thermoelectric material comprising:

a complex oxide represented by the formula $Ca_aA^1_bCo_cA^2_dO_e$ wherein $A^1$ is one or more elements selected from the group consisting of Na, K, Li, Ti, V, Cr, Mn, Fe, Ni, Cu, Zn, Pb, Sr, Ba, Al, Bi, Y, and lanthanoids; $A^2$ is one or more elements selected from the group consisting of Ti, V, Cr, Mn, Fe, Ni, Cu, Mo, W, Nb, and Ta; $2.2 \leq a \leq 3.6$; $0 \leq b \leq 0.8$; $2 \leq c \leq 4.5$; $0 \leq d \leq 2$; and $8 \leq e \leq 10$; or a complex oxide represented by the formula $Bi_fPb_gM^1_hCo_iM^2_jO_k$ wherein $M^1$ is one or more elements selected from the group consisting of Na, K, Li, Ti, V, Cr, Mn, Fe, Ni, Cu, Zn, Pb, Ca, Sr, Ba, Al, Y, and lanthanoids; $M^2$ is one or more elements selected from the group consisting of Ti, V, Cr, Mn, Fe, Ni, Cu, Mo, W, Nb, and Ta; $1.8 \leq f \leq 2.2$; $0 \leq g \leq 0.4$; $1.8 \leq h \leq 2.2$; $1.6 \leq i \leq 2.2$; $0 \leq j \leq 0.5$; and $8 \leq k \leq 10$;

the n-type thermoelectric material comprising:

a complex oxide represented by the formula $Ln_mR^1_nNi_pR^2_qO_r$ wherein Ln is one or more elements selected from the group consisting of lanthanoids; $R^1$ is one or more elements selected from the group consisting of Na, K, Sr, Ca, and Bi; $R^2$ is one or more elements selected from the group consisting of Ti, V, Cr, Mn, Fe, Ni, Cu, Mo, W, Nb, and Ta; $0.5 \leq m \leq 1.2$; $0 \leq n \leq 0.5$; $0.5 \leq p \leq 1.2$; $0 \leq q \leq 0.5$; and $2.7 \leq r \leq 3.3$; or a complex oxide represented by the formula $(Ln_sR^3_t)_2Ni_uR^4_vO_w$ wherein Ln is one or more elements selected from the group consisting of lanthanoids; $R^3$ is one or more elements selected from the group consisting of Na, K, Sr, Ca, and Bi; $R^4$ is one or more elements selected from the group consisting of Ti, V, Cr, Mn, Fe, Ni, Cu, Mo, W, Nb, and Ta; $0.5 \leq s \leq 1.2$; $0 \leq t \leq 0.5$; $0.5 \leq u \leq 1.2$; $0 \leq v \leq 0.5$; and $3.6 \leq r \leq 4.4$;

the electrically conductive paste for connecting the p-type thermoelectric material comprising:

(i) at least one powdery oxide selected from the group consisting of a complex oxide represented by the formula $Ca_aA^1_bCo_cA^2_dO_e$ wherein $A^1$ is one or more elements selected from the group consisting of Na, K, Li, Ti, V, Cr, Mn, Fe, Ni, Cu, Zn, Pb, Sr, Ba, Al, Bi, Y, and lanthanoids; $A^2$ is one or more elements selected from the group consisting of Ti, V, Cr, Mn, Fe, Ni, Cu, Mo, W, Nb, and Ta; $2.2 \leq a \leq 3.6$; $0 \leq b \leq 0.8$; $2 \leq c \leq 4.5$; $0 \leq d \leq 2$; and $8 \leq e \leq 10$; and a complex oxide represented by the formula $Bi_fPb_gM^1_hCo_iM^2_jO_k$ wherein $M^1$ is one or more elements selected from the group consisting of Na, K, Li, Ti, V, Cr, Mn, Fe, Ni, Cu, Zn, Pb, Ca, Sr, Ba, Al, Y, and lanthanoids; $M^2$ is one or more elements selected from the group consisting of Ti, V, Cr, Mn, Fe, Ni, Cu, Mo, W, Nb, and Ta; $1.8 \leq f \leq 2.2$; $0 \leq g \leq 0.4$; $1.8 \leq h \leq 2.2$; $1.6 \leq i \leq 2.2$; $0 \leq j \leq 0.5$; and $8 \leq k \leq 10$; and (ii) at least one powdery electrically conductive metal selected from the group consisting of gold, silver, platinum, and alloys containing at least one of these metals; and the electrically conductive paste for connecting the n-type thermoelectric material comprising:

(i) at least one powdery oxide selected from the group consisting of a complex oxide represented by the formula $Ln_mR^1_nNi_pR^2_qO_r$ wherein Ln is one or more elements selected from the group consisting of lanthanoids; $R^1$ is one or more elements selected from the group consisting of Na, K, Sr, Ca, and Bi; $R^2$ is one or more elements selected from the group consisting of Ti, V, Cr, Mn, Fe, Ni, Cu, Mo, W, Nb, and Ta; $0.5 \leq m \leq 1.2$; $0 \leq n \leq 0.5$; $0.5 \leq p \leq 1.2$; $0 \leq q \leq 0.5$; and $2.7 \leq r \leq 3.3$; and a complex oxide represented by the formula $(Ln_sR^3_t)_2Ni_uR^4_vO_w$ wherein Ln is one or more elements selected from the group consisting of lanthanoids; $R^3$ is one or more elements selected from the group consisting of Na, K, Sr, Ca, and Bi; $R^4$ is one or more elements selected from the group consisting of Ti, V, Cr, Mn, Fe, Ni, Cu, Mo, W, Nb, and Ta; $0.5 \leq s \leq 1.2$; $0 \leq t \leq 0.5$; $0.5 \leq u \leq 1.2$; $0 \leq v \leq 0.5$; and $3.6 \leq r \leq 4.4$; and (ii) at least one powdery electrically conductive metal selected from the group consisting of gold, silver, platinum, and alloys containing at least one of these metals.

Item 14. A thermoelectric element wherein one end of a p-type thermoelectric material and one end of an n-type thermoelectric material are each connected to an electrically conductive substrate with an electrically conductive paste;

the p-type thermoelectric material comprising a complex oxide represented by the formula $Ca_aA^1_bCo_4O_e$ wherein $A^1$ is one or more elements selected from the group consisting of Na, K, Li, Ti, V, Cr, Mn, Fe, Ni, Cu, Zn, Pb, Sr, Ba, Al, Bi, Y, and lanthanoids; $2.2 \leq a \leq 3.6$; $0 \leq b \leq 0.8$; and $8 \leq e \leq 10$; or a complex oxide represented by the formula $Bi_fPb_gM^1_hCo_2O_k$ wherein $M^1$ is one or more elements selected from the group consisting of Sr, Ca, and Ba; $1.8 \leq f \leq 2.2$; $0 \leq g \leq 0.4$; $1.8 \leq h \leq 2.2$; and $8 \leq k \leq 10$;

the n-type thermoelectric material comprising a complex oxide represented by the formula $La_mR^1_nNiO_r$ wherein $R^1$ is one or more elements selected from the group consisting of Na, K, Sr, Ca, and Bi; $0.5 \leq m \leq 1.2$; $0 \leq n \leq 0.5$; and $2.7 \leq r \leq 3.3$; or a complex oxide represented by the formula $(La_sR^3_t)_2NiO_w$ wherein $R^3$ is one or more elements selected from the group consisting of Na, K, Sr, Ca, and Bi: $0.5 \leq s \leq 1.2$; $0 \leq t \leq 0.5$; and $3.6 \leq w \leq 4.4$;

the electrically conductive paste for connecting the p-type thermoelectric material to the electrically conductive substrate comprising (i) at least one powdery oxide selected from the group consisting of a complex oxide represented by the formula $Ca_aA^1_bCo_4O_e$ wherein $A^1$ is one or more elements selected from the group consisting of Na, K, Li, Ti, V, Cr, Mn, Fe, Ni, Cu, Zn, Pb, Sr, Ba, Al, Bi, Y, and lanthanoids; $2.2 \leq a \leq 3.6$; $0 \leq b \leq 0.8$; and $8 \leq e \leq 10$; and a complex oxide represented by the formula $Bi_f Pb_g M^1{}_h Co_2 O_k$ wherein $M^1$ is one or more elements selected from the group consisting of Sr, Ca, and Ba; $1.8 \leq f \leq 2.2$; $0 \leq g \leq 0.4$; $1.8 \leq h \leq 2.2$; and $8 \leq k \leq 10$; and (ii) at least one powdery electrically conductive metal selected from the group consisting of gold, silver, platinum, and alloys containing at least one of these metals; and the electrically conductive paste for connecting the n-type thermoelectric material to the electrically conductive substrate comprising (i) at least one powdery oxide selected from the group consisting of a complex oxide represented by the formula $La_m R^1{}_n NiO_r$ wherein $R^1$ is one or more elements selected from the group consisting of Na, K, Sr, Ca, and Bi; $0.5 \leq m \leq 1.2$; $0 \leq n \leq 0.5$; and $2.7 \leq r \leq 3.3$; and a complex oxide represented by the formula $(La_s R^3{}_t)_2 NiO_w$ wherein $R^3$ is one or more elements selected from the group consisting of Na, K, Sr, Ca, and Bi: $0.5 \leq s \leq 1.2$; $0 \leq t \leq 0.5$; and $3.6 \leq w \leq 4.4$; and (ii) at least one powdery electrically conductive metal selected from the group consisting of gold, silver, platinum, and alloys containing at least one of these metals.

Item 15. A thermoelectric module comprising a plurality of the thermoelectric elements of Item 12, wherein the thermoelectric elements are connected in series such that an unbonded end portion of the p-type thermoelectric material of one thermoelectric element is connected to an unbonded end portion of the n-type thermoelectric material of another thermoelectric element on a substrate.

Item 16. A thermoelectric conversion method comprising positioning one side of the thermoelectric module of Item 15 at a high-temperature environment and positioning the other side of the module at a low-temperature environment.

Item 17. A thermoelectric module comprising a plurality of the thermoelectric elements of Item 13, wherein the thermoelectric elements are connected in series such that an unbonded end portion of a p-type thermoelectric material of one thermoelectric element is connected to an unbonded end portion of an n-type thermoelectric material of another thermoelectric element on a substrate.

Item 18. A thermoelectric conversion method comprising positioning one side of the thermoelectric module of Item 17 at a high-temperature environment and positioning the other side of the module at a low-temperature environment.

Hereinafter, the paste for connecting thermoelectric materials of the invention is described in detail.

Electrically Conductive Paste for Connecting Thermoelectric Materials

The electrically conductive paste for connecting thermoelectric materials of the invention comprises a specific powdery oxide and at least one powdery electrically conductive metal selected from the group consisting of gold, silver, platinum, and alloys containing at least one of these metals as an essential ingredient. These ingredients are described below.

(i) Powdery Electrically Conductive Metal

Usable as the powdery electrically conductive metal are noble metals such as silver, gold, and platinum; alloys containing at least one of such noble metals; etc. Usable as such noble metal-containing alloys are alloys containing 30% or more by weight, with about 70% or more by weight being preferable, of noble metal, such as silver, gold, or platinum. Alloys containing two or more noble metals may be used.

Such a powdery electrically conductive metal can be used singly or in combination of two or more types. The particle size of such a powdery electrically conductive metal is not limited, but it is preferably such that the size of about 80% or more of the metal particles is within the range of about 0.1 μm to about 30 μm.

(ii) Powdery Oxide

Used as a powdery oxide is at least one powdery oxide selected from the group consisting of complex oxides (a) to (d):

(a) a complex oxide represented by the formula $Ca_a A^1{}_b Co_c A^2{}_d O_e$ wherein $A^1$ is one or more elements selected from the group consisting of Na, K, Li, Ti, V, Cr, Mn, Fe, Ni, Cu, Zn, Pb, Sr, Ba, Al, Bi, Y, and lanthanoids; $A^2$ is one or more elements selected from the group consisting of Ti, V, Cr, Mn, Fe, Ni, Cu, Mo, W, Nb, and Ta; $2.2 \leq a \leq 3.6$; $0 \leq b \leq 0.8$; $2 \leq c \leq 4.5$; $0 \leq d \leq 2$; and $8 \leq e \leq 10$;

(b) a complex oxide represented by the formula $Bi_f Pb_g M^1{}_h Co_i M^2{}_j O_k$ wherein $M^1$ is one or more elements selected from the group consisting of Na, K, Li, Ti, V, Cr, Mn, Fe, Ni, Cu, Zn, Pb, Ca, Sr, Ba, Al, Y, and lanthanoids; $M^2$ is one or more elements selected from the group consisting of Ti, V, Cr, Mn, Fe, Ni, Cu, Mo, W, Nb, and Ta; $1.8 \leq f \leq 2.2$; $0 \leq g \leq 0.4$; $1.8 \leq h \leq 2.2$; $1.6 \leq i \leq 2.2$; $0 \leq j \leq 0.5$; and $8 \leq k \leq 10$;

(c) a complex oxide represented by the formula $Ln_m R^1{}_n Ni_p R^2{}_q O_r$ wherein Ln is one or more elements selected from the group consisting of lanthanoids; $R^1$ is one or more elements selected from the group consisting of Na, K, Sr, Ca, and Bi; $R^2$ is one or more elements selected from the group consisting of Ti, V, Cr, Mn, Fe, Ni, Cu, Mo, W, Nb, and Ta; $0.5 \leq m \leq 1.2$; $0 \leq n \leq 0.5$; $0.5 \leq p \leq 1.2$; $0 \leq q \leq 0.5$; and $2.7 \leq r \leq 3.3$; and (d) a complex oxide represented by the formula $(Ln_s R^3{}_t)_2 Ni_u R^4{}_v O_w$ wherein Ln is one or more elements selected from the group consisting of lanthanoids; $R^3$ is one or more elements selected from the group consisting of Na, K, Sr, Ca, and Bi; $R^4$ is one or more elements selected from the group consisting of Ti, V, Cr, Mn, Fe, Ni, Cu, Mo, W, Nb, and Ta; $0.5 \leq s \leq 1.2$; $0 \leq t \leq 0.5$; $0.5 \leq u \leq 1.2$; $0 \leq v \leq 0.5$; and $3.6 \leq r \leq 4.4$.

By using the above powdery oxide in combination with at least one powdery electrically conductive metal selected from the group consisting of gold, silver, platinum, and alloys containing at least one of these metals, the thermal expansion coefficient of the connecting portion can be made close to that of the thermoelectric material, unlike the single use of such a powdery electrically conductive metal. Thus, separation at the connecting portion can be prevented even when high-temperature power generation is repeated. Such a powdery oxide has good electrical conductivity and thus can give favorable electrical conductivity to the connecting portion.

In each formula above, examples of lanthanoids include La, Ce, Pr, Nd, Sm, Eu, Gd, Tb, Dy, Ho, Er, Tm, Lu, etc.

As preferable examples among the above-described complex oxides, the following complex oxides can be mentioned:

(a') a complex oxide represented by the formula $Ca_a A^1{}_b Co_4 O_e$ wherein $A^1$ is one or more elements selected from the group consisting of Na, K, Li, Ti, V, Cr, Mn, Fe, Ni, Cu, Zn, Pb, Sr, Ba, Al, Bi, Y, and lanthanoids; $2.2 \leq a \leq 3.6$; $0 \leq b \leq 0.8$; and $8 \leq e \leq 10$;

(b') a complex oxide represented by the formula $Bi_f Pb_g M^1{}_h CO_2 O_k$ wherein $M^1$ is one or more elements selected from the group consisting of Sr, Ca, and Ba; $1.8 \leq f \leq 2.2$; $0 \leq g \leq 0.4$; $1.8 \leq h \leq 2.2$; and $8 \leq k \leq 10$;

(c') a complex oxide represented by the formula $La_m R^1{}_n NiO_r$ wherein $R^1$ is one or more elements selected from the group consisting of Na, K, Sr, Ca, and Bi; $0.5 \leq m \leq 1.2$; $0 \leq n \leq 0.5$; and $2.7 \leq r \leq 3.3$; and (d') a complex oxide represented by the formula $(La_sR^3_t)_2NiO_w$ wherein $R^3$ is one or more elements selected from the group consisting of Na, K, Sr, Ca, and Bi: $0.5 \leq s \leq 1.2$; $0 \leq t \leq 0.5$; and $3.6 \leq w \leq 4.4$.

The complex oxides represented by the above formulae $Ca_aA^1_bCO_cA^2_dO_e$, $Bi_fPb_gM^1_hCo_jM^2_jO_k$, $Ln_mR^1_nNi_pR^2_qO_r$, and $(Ln_sR^3_t)_2Ni_uR^4_vO_w$ may be in the form of single crystals or polycrystals.

There are no limitations on the methods for producing such complex oxides insofar as a single crystal or a polycrystal having the above-mentioned composition can be produced.

Crystal-structured complex oxides having the above-specified composition may be produced by known methods. Examples of known methods include single crystal-producing methods such as flux methods, zone-melting methods, crystal pulling methods, glass annealing methods via glass precursor, and the like; powder-producing methods such as solid phase reaction methods, sol-gel methods, and the like; film-forming methods such as sputtering methods, laser ablation methods, chemical vapor deposition methods, and the like; etc.

As an example, a process for preparing the complex oxide according to a solid phase reaction method among the above methods is described below in detail.

The above-described complex oxides can be produced by, for example, mixing starting materials in the corresponding proportions to the proportions of the elemental components of the desired complex oxide, and sintering.

The sintering temperature and the sintering time are not limited as long as the desired complex oxide can be obtained. For example, sintering may be conducted at about 700° C. to about 1200° C. for about 10 to about 40 hours. When carbonates, organic compounds, or the like are used as starting materials, the starting materials are preferably decomposed by calcination prior to sintering, and then sintered to give the desired complex oxide. For example, when carbonates are used as starting materials, they may be calcined at about 700° C. to about 900° C. for about 10 hours, and then sintered under the above-mentioned conditions. Sintering means are not limited, and any means may be used, including electric furnaces and gas furnaces. Usually, sintering may be conducted in an oxidizing atmosphere such as in an oxygen stream or air. When the starting materials contain a sufficient amount of oxygen, sintering in, for example, an inert atmosphere is also possible. The amount of oxygen in the complex oxide to be produced can be controlled by adjusting the partial pressure of oxygen during sintering, sintering temperature, sintering time, etc. The higher the partial pressure of oxygen is, the higher the oxygen ratio in the above formulae can be. For the preparation of a desired complex oxide according to a solid phase reaction method, it is preferable to prepare a press-molded product from a starting material to sinter the molded product so that the solid phase reaction proceeds efficiently. In this case, the sintered product obtained may be crushed to prepare a powdery material with an appropriate particle size.

In the glass annealing method via a glass precursor, starting materials are first melted and rapidly cooled for solidification. Any melting conditions can be employed as long as the starting materials can be uniformly melted. For example, when a crucible of alumina is used as a vessel for the melting operation, it is desirable to heat the starting materials to about 1200° C. to about 1400° C. to prevent contamination with the vessel and to inhibit vaporization of the starting materials. The heating time is not limited, and the heating is continued until a uniform melt is obtained. The heating time is usually about 30 minutes to about 1 hour. The heating means are not limited, and any heating means can be employed, including electric furnaces, gas furnaces, etc. The melting can be conducted, for example, in an oxygen-containing atmosphere such as air or an oxygen stream adjusted to a flow rate of about 300 ml/min or less. In the case of starting materials containing a sufficient amount of oxygen, the melting may be conducted in an inert atmosphere.

The rapid cooling conditions are not limited. The cooling may be conducted to the extent that at least the surface of the solidified product becomes a glassy amorphous layer. For example, the melt can be rapidly cooled by allowing the melt to flow over a metal plate and compressing the melt from above. The cooling rate may be usually about 500° C./sec or greater, and preferably $10^{3\circ}$ C./sec or greater.

Subsequently, the product solidified by rapid cooling is heat-treated in an oxygen-containing atmosphere, whereby fibrous single crystals of the desired complex oxide grow from the surface of the solidified product.

The heat treatment temperature may be in the range of about 880° C. to about 930° C. The heat treatment may be conducted in an oxygen-containing atmosphere such as in air or an oxygen stream. When the heat treatment is effected in an oxygen stream, the stream may be adjusted to a flow rate of, for example, about 300 ml/min or less, a flow rate of 300 ml/min or higher is also acceptable. The heat treatment time is not limited and can be determined according to the intended degree of growth of the single crystal. The heat treatment time is usually about 60 hours to about 1000 hours.

The mixing ratio of the starting materials can be set depending on the chemical composition of the desired complex oxide. More specifically, when a fibrous complex oxide single crystal is formed from the amorphous layer of the surface of the solidified product, the oxide single crystal that grows has the composition of the solid phase in phase equilibrium with the composition of a melt of the amorphous layer, which is considered a liquid phase, of the surface part of the solidified product. Therefore, the mixing ratio of the starting materials can be set based on the relationship of the chemical composition of the solid phase (single crystal) and the chemical composition of the liquid phase (amorphous layer) in phase equilibrium.

The size of the complex oxide single crystal thus obtained varies depending on the kind of starting materials, composition ratio, heat treatment conditions, and so on. The single crystal may be fibrous, for example, having a length of about 10 μm to about 1000 μm, a width of about 20 μm to about 200 μm, and a thickness of about 1 μm to about 5 μm.

In both the glass annealing method via glass precursor and the solid phase reaction method, the amount of oxygen contained in the obtained product can be controlled according to the flow rate of oxygen during heating. The higher the flow rate of oxygen is, the greater the amount of oxygen in the product can be. Variation in the amount of oxygen in the product does not seriously affect the electrical characteristics of the complex oxide. The starting materials are not limited as long as they can produce oxides when heated. Useful starting materials are metals, oxides, compounds (such as carbonates), etc. Examples of Ca sources include calcium oxide (CaO), calcium chloride ($CaCl_2$), calcium carbonate ($CaCO_3$), calcium nitrate (Ca $(NO_3)_2$), calcium hydroxide (Ca $(OH)_2$), alkoxides such as dimethoxy calcium (Ca $(OCH_3)_2$), diethoxy calcium (Ca $(OC_2H_5)_2$), dipropoxy calcium ($Ca(OC_3H_7)_2$), and the like, etc. Examples of Co sources include cobalt oxide (CoO, $Co_2O_3$, and $Co_3O_4$), cobalt chloride ($CoCl_2$), cobalt carbonate ($COCO_3$), cobalt nitrate ($Co(NO_3)_2$), cobalt hydroxide ($Co(OH)_2$), alkoxides such as dipropoxy cobalt ($Co(OC_3H_7)_2$), and the like, etc. Similarly, examples of usable sources of other elements are metals, oxides, chlorides, carbonates, nitrates, hydroxides, alkoxides, etc. Compounds containing two or more constituent elements of the complex oxide are also usable.

There is no limitation on the particle size of the powder of at lest one complex oxide selected from the group consisting of complex oxides represented by the formulae $Ca_aA^1_bCo_cA^2_dO_e$, $Bi_fPb_gM^1_hCo_iM^2_jO_k$; $M^2_jO_k$, $Ln_mR^1_nNi_pR^2_qO_r$, and $(Ln_sR^3_t)_2Ni_uR^4_vO_w$, but it is preferably such that the size of about 80% or more of such oxide particles is preferably 50 µm or smaller, and preferably about 1 µm to about 10 µm.

(iii) Electrically Conductive Paste Composition

The electrically conductive paste for connecting thermoelectric materials of the invention comprises (i) at least one powdery complex oxide selected from the group consisting of complex oxides represented by the formulae (a) $Ca_aA^1_bCo_cA^2_dO_e$, wherein $A^1$, $A^2$, a, b, c, d, and e are as above, (b) $Bi_fPb_gM^1_hCo_jM^2_jO_k$, wherein $M^1$, $M^2$, f, g, h, i, j, and k are as above, (c) $Ln_mR^1_nNi_pR^2_qO_r$, wherein Ln, $R^1$, $R^2$, m, n, p, q, and r are as above, and (d) $(Ln_sR^3_t)_2Ni_uR^4_vO_w$, wherein Ln, $R^3$, $R^4$, s, t, u, v, and w are as above, and (ii) at least one powdery electrically conductive metal selected from the group consisting of gold, silver, platinum, and alloys containing at least one of these metals.

In general, the electrically conductive paste may further comprise a glass ingredient, resin ingredient, etc., in addition to the above-described powdery oxide and powdery electrically conductive metal.

Among these, a glass ingredient primarily exhibits bonding strength when the paste is applied to a connecting portion and heated. A glass ingredient to be mixed in the electrically conductive paste may be selected from glass ingredients which melt and exhibit bonding strength when heated for bonding and which can maintain sufficient bonding strength without melting when used for thermoelectric generation.

Such a glass ingredient may be suitably selected from glass ingredients mixed in known electrically conductive pastes. For example, borosilicate bismuth glass, borosilicate lead glass, etc. can be used.

A resin ingredient imparts suitable dispersibility, thixotropy, viscosity characteristic, etc. to the pastes. Examples of resin ingredients include ethyl cellulose, hydroxyethyl cellulose, methyl cellulose, nitrocellulose, ethyl cellulose derivatives, acryl-based resins, butyral resins, alkydphenol resins, epoxy resins, wood rosin, etc.

The proportions of each component are not limited, and may be suitably determined according to the desired electrical conductivity, thermal expansion coefficient, bonding strength, viscosity characteristic, etc.

For example, the oxide powder content is preferably about 0.5 to about 20 parts by weight, and more preferably about 1 to about 15 parts by weight, per 100 parts by weight of electrically conductive metal powder.

The glass ingredient content may be, for example, about 0.5 to about 10 parts by weight, and preferably about 1 to about 7 parts by weight, per 100 parts by weight of electrically conductive metal powder, but can be used in amounts outside these ranges.

Similarly, the resin ingredient content is not limited, and may be suitably set such that suitable workability and sufficient adherence can be demonstrated. For example, the resin ingredient may be contained in an amount of about 0.5 to 20 parts by weight, preferably about 1 to 10 parts by weight, and more preferably about 1 to 5 parts by weight, per 100 parts by weight of electrically conductive metal powder.

The electrically conductive paste of the invention may comprise another oxide powder, if required. The type, amount, etc. of such oxide powder may be suitably determined in the range where the above-described effects are not adversely effected. For example, it is possible to add an n-type thermoelectric material powder to an electrically conductive paste for connecting p-type thermoelectric materials.

The electrically conductive paste of the invention may further comprise additives, such as a solvent, plasticizer, lubricant, antioxidant, and viscosity controller contained in known electrically conductive pastes. Examples of solvents include terpineol, butylcarbitol acetate, etc., and these solvents can be suitably mixed. The amount of such ingredients may be suitably determined depending on the desired properties. For example, a solvent can be contained in an amount of about 3 to about 30 parts by weight, and preferably about 5 to about 20 parts by weight, per 100 parts by weight of electrically conductive metal powder.

The above-described electrically conductive paste for connecting thermoelectric materials can be used for connecting any type of thermoelectric material, such as a p-type thermoelectric material and an n-type thermoelectric material, to an electrically conductive substrate. By connecting a thermoelectric material to an electrically conductive substrate using the paste for connecting thermoelectric materials, a suitable electroconductivity is imparted to the connecting portion of the thermoelectric material. Further, even when high-temperature power generation is repeated, separation at the connecting portion is not likely to occur and a favorable thermoelectric performance can be maintained over a long period of time.

Preferably, a p-type thermoelectric material is connected to an electrically conductive substrate using as an oxide powder at least one powdery oxide selected from the group consisting of complex oxides represented by the formulae $Ca_aA^1_bCo_cA^2_dO_e$, wherein $A^1$, $A^2$, a, b, c, d, and e are as above, and $Bi_fPb_gM^1_hCo_iM^2_jO_k$, wherein $M^1$, $M^2$, f, g, h, i, j, and k are as above. Such complex oxides exhibit p-type thermo electric material properties. Thus, when a paste containing such complex oxide(s) is used for connecting p-type thermoelectric material, favorable electroconductivity can be imparted to the connecting portion while not adversely affecting the thermoelectric properties of the p-type thermoelectric material, and moreover the thermal expansion coefficient of the connecting portion can be made close to that of the thermoelectric material.

An n-type thermoelectric material is preferably connected to an electrically conductive substrate using as an oxide powder at least one powdery oxide selected from the group consisting of complex oxides represented by the formulae $Ln_mR^1_nNi_pR^2_qO_r$, wherein Ln, $R^1$, $R^2$, m, n, p, q, and r are as above, and $(Ln_sR^3_t)_2Ni_uR^4_vO_w$, wherein Ln, $R^3$, $R^4$, s, t, u, and v are as above. Such complex oxides exhibit n-type thermoelectric material properties. Thus, when a paste containing such complex oxide is used for connecting n-type thermoelectric material, favorable electroconductivity can be imparted to the connecting portion while not adversely affecting the thermoelectric properties of the n-type thermoelectric material, and moreover the thermal expansion coefficient of the connecting portion can be made close to that of the thermoelectric material.

Thermoelectric Element

The thermoelectric element of the present invention is formed by connecting one end of p-type thermoelectric material and one end of an n-type thermoelectric material to an electrically conductive substrate.

Used as each of an electrically conductive paste for connecting p-type thermoelectric materials and an electrically conductive paste for connecting n-type thermoelectric materials is an electrically conductive paste, comprising:

(i) at least one powdery complex oxide selected from the group consisting of complex oxides represented by the formulae:

(a) $Ca_aA^1_bCo_cA^2_dO_e$, wherein $A^1$, $A^2$, a, b, c, d, and e are as above, (b) $Bi_fPb_gM^1_hCo_iM^2_jO_k$, wherein $M^1$, $M^2$, f, g, h, i, j, and k are as above, (c) $Ln_mR^1_nNi_pR^2_qO_r$, wherein Ln, $R^1$, $R^2$, m, n, p, q, and r are as above, and (d) $(Ln_sR^3_t)_2Ni_uR^4_vO_w$, wherein Ln, $R^3$, $R^4$, s, t, u, and v are as above, and (ii) at least one powdery electrically conductive metal selected from the group consisting of gold, silver, platinum, and alloys containing at least one of these metals.

The composition of the electrically conductive paste for connecting p-type thermoelectric materials and the composition of the electrically conductive paste for connecting n-type thermoelectric materials may be the same or different. In particular, the use of electrically conductive pastes with the same composition can facilitate the application thereof, thereby efficiently producing thermoelectric elements.

When a paste containing a complex oxide with properties as a p-type thermoelectric material is used for connecting a p-type thermoelectric material to an electrically conductive substrate and a paste containing a complex oxide with properties as an n-type thermoelectric material is used for connecting an n-type thermoelectric material to an electrically conductive substrate, higher-performance thermoelectric elements can be obtained in which the p-type thermoelectric material properties and n-type thermoelectric material properties are less adversely affected at each connecting portion. In this case, the electrically conductive paste for connecting p-type thermoelectric materials comprises at least one powdery complex oxide selected from the group consisting of complex oxides represented by the formulae $Ca_aA^1_bCo_cA^2_dO_e$, wherein $A^1$, $A^2$, a, b, c, d, and e are as above and $Bi_fPb_gM^1_hCo_iM^2_jO_k$, wherein $M^1$, $M^2$, f, g, h, i, j, and k are as above. The electrically conductive paste for connecting n-type thermoelectric materials comprises at least one powdery complex oxide selected from the group consisting of complex oxides represented by the formulae $Ln_mR^1_nNi_pR^2_qO_r$, wherein Ln, $R^1$, $R^2$, m, n, p, q, and r are as above, and $(Ln_sR^3_t)_2Ni_uR^4_vO_w$, wherein Ln, $R^3$, $R^4$, s, t, u, and v are as above.

Accordingly, the pastes for connecting the p-type thermoelectric material and n-type thermoelectric material to the electrically conductive substrate may be of the same or different composition, and can be suitably selected considering the production efficiency and desired performance of a thermoelectric element to be obtained.

There is no limitation on the p-type thermoelectric materials for use in the thermoelectric element of the invention. However, among the complex oxide powders to be mixed in the electrically conductive paste for connecting thermoelectric materials of the invention, it is preferable to use, for the p-type thermoelectric material, a complex oxide represented by the formula $Ca_aA^1_bCO_cA^2_dO_e$ wherein $A^1$ is one or more elements selected from the group consisting of Na, K, Li, Ti, V, Cr, Mn, Fe, Ni, Cu, Zn, Pb, Sr, Ba, Al, Bi, Y, and lanthanoids; $A^2$ is one or more elements selected from the group consisting of Ti, V, Cr, Mn, Fe, Ni, Cu, Mo, W, Nb, and Ta; $2.2 \leq a \leq 3.6$; $0 \leq b \leq 0.8$; $2 \leq c \leq 4.5$; $0 \leq d \leq 2$; and $8 \leq e \leq 10$; or a complex oxide represented by the formula $Bi_fPb_gM^1_hCo_iM^2_jO_k$ wherein $M^1$ is one or more elements selected from the group consisting of Na, K, Li, Ti, V, Cr, Mn, Fe, Ni, Cu, Zn, Pb, Ca, Sr, Ba, Al, Y, and lanthanoids; $M^2$ is one or more elements selected from the group consisting of Ti, V, Cr, Mn, Fe, Ni, Cu, Mo, W, Nb, and Ta; $1.8 \leq f \leq 2.2$; $0 \leq g \leq 0.4$; $1.8 \leq h \leq 2.2$; $1.6 \leq i \leq 2.2$; $0 \leq j \leq 0.5$; and $8 \leq k \leq 10$. Such thermoelectric materials may be in the form of single crystals, sintered polycrystals, or thin-films, and can be produced in the same manner as the complex oxide to be mixed in the electrically conductive paste, such as single crystal-producing methods such as flux methods, zone-melting methods, crystal pulling methods, glass annealing methods via a glass precursor, and the like; powder-producing methods such as solid phase reaction methods, sol-gel methods, and the like; thin film-forming methods such as sputtering methods, laser ablation methods, chemical vapor deposition methods, and the like; etc.

The complex oxides represented by the above formulae have a laminated structure with alternating rock-salt structure layers and $CoO_2$ layers, wherein the rock-salt structure layers have the components Ca, Co, and O in the ratio of $Ca_2CoO_3$, or the components Bi, $M^1$, and in the ratio of $Bi_2M^1_2O_4$; and the $CoO_2$ layers have octahedrons with octahedral coordination of six O to one Co, the octahedrons being arranged two-dimensionally such that they share one another's sides. In the former case, some of the Ca in $Ca_2CoO_3$ is substituted by $A^1$, and some of the Co of this layer and some of the Co of the $CoO_2$ layer are further substituted by $A^2$. In the latter case, some of the Bi is substituted by Pb or some of $M^1$, and some of the Co is substituted by $M^2$.

The complex oxides represented by the above formulae exhibit properties as p-type thermoelectric materials in that when a temperature difference is created between both ends of the oxide material, the electric potential generated by the Seebeck effect is lower at the high-temperature side than at the low-temperature side. More specifically, the above complex oxides have a Seebeck coefficient of at least 100 µV/K and an electrical resistivity of not more than about 10 mΩcm at temperatures of 100 K (absolute temperature) or higher. The Seebeck coefficient tends to increase and the electrical resistivity tends to decrease as the temperature rises.

Among the complex oxides for use in the p-type thermoelectric material, preferable examples include complex oxides represented by the formula $Ca_aA^1_bCo_4O_e$ wherein $A^1$ is one or more elements selected from the group consisting of Na, K, Li, Ti, V, Cr, Mn, Fe, Ni, Cu, Zn, Pb, Sr, Ba, Al, Bi, Y, and lanthanoids; $2.2 \leq a \leq 3.6$; $0 \leq b \leq 0.8$; and $8 \leq e \leq 10$; and complex oxides represented by the formula $Bi_fPb_gM^1_hCo_2O_k$ wherein $M^1$ is one or more elements selected from the group consisting of Sr, Ca, and Ba; $1.8 \leq f \leq 2.2$; $0 \leq g \leq 0.4$; $1.8 \leq h \leq 2.2$; and $8 \leq k \leq 10$.

There is no limitation on the n-type thermoelectric materials for use in the thermoelectric element of the invention. In particular, among the complex oxide powders to be mixed in the electrically conductive paste for connecting thermoelectric materials of the invention, it is preferable to use, for the n-type thermoelectric material, complex oxides represented by the formula $Ln_mR^1_nNi_pR^2_qO_r$ wherein Ln is one or more elements selected from the group consisting of lanthanoids; $R^1$ is one or more elements selected from the group consisting of Na, K, Sr, Ca, and Bi; $R^2$ is one or more elements selected from the group consisting of Ti, V, Cr, Mn, Fe, Ni, Cu, Mo, W, Nb, and Ta; $0.5 \leq m \leq 1.2$; $0 \leq n \leq 0.5$; $0.5 \leq p \leq 1.2$; $0 \leq q \leq 0.5$; and $2.7 \leq r \leq 3.3$; or complex oxides represented by the formula $(Ln_sR^3_t)_2Ni_uR^4_vO_w$ wherein Ln is one or more elements selected from the group consisting of lanthanoids; $R^3$ is one or more elements selected from the group consisting of Na, K, Sr, Ca, and Bi; $R^4$ is one or more elements selected from the group consisting of Ti, V, Cr, Mn, Fe, Ni, Cu, Mo, W, Nb, and Ta; $0.5 \leq s \leq 1.2$; $0 \leq t \leq 0.5$; $0.5 \leq u \leq 1.2$; $0 \leq v \leq 0.5$; and $3.6 \leq w \leq 4.4$. Such thermoelectric materials may be in the form of sintered polycrystals, single crystals, or thin-films, and can be produced in the same manner as the complex oxide(s) to be mixed in the electrically conductive paste. Examples of such method include single crystal-producing methods such as flux methods, zone-melting methods, crystal pulling methods, glass annealing methods via a glass precursor, and the like; powder-producing methods such as solid phase reaction methods, sol-gel methods, and the like; thin film-forming methods such as sputtering methods, laser ablation methods, chemical vapor deposition methods, and the like; etc.

The former of the above two kinds of complex oxides has a perovskite-type crystal structure, which is generally referred to as an $ABO_3$ structure. The latter of the above two kinds of complex oxides has a so-called layered perovskite-type crystal structure, which is generally referred to as an $A_2BO_4$ structure. In these complex oxides, some of Ln is substituted by $R^1$ or $R^3$, and some of Ni is substituted by $R^2$ or $R^4$.

The complex oxides represented by the above formulae have a negative Seebeck coefficient and exhibit properties as n-type thermoelectric materials in that when a temperature difference between both ends of the oxide material is created, the electric potential generated by the Seebeck effect is higher at the high-temperature side than at the low-temperature side. More specifically, the above complex oxides have a Seebeck coefficient of about $-1$ µV/K to $-30$ µV/K and exhibit low electrical resistances at temperatures of 100 K or higher. For example, the complex oxides tend to exhibit an electrical resistivity of not more than about 10 mΩcm at temperatures of 100 K or higher.

Among the complex oxides to be used as the n-type thermoelectric material, preferable examples of complex oxides include complex oxides represented by the formula $La_m R^1_n NiO_r$ wherein $R^1$ is one or more elements selected from the group consisting of Na, K, Sr, Ca, and Bi; $0.5 \leq m \leq 1.2$; $0 \leq n \leq 0.5$; and $2.7 \leq r \leq 3.3$; and complex oxides represented by the formula $(La_s R^3_t)_2 NiO_w$ wherein $R^3$ is one or more elements selected from the group consisting of Na, K, Sr, Ca, and Bi: $0.5 \leq s \leq 1.2$; $0 \leq t \leq 0.5$; and $3.6 \leq w \leq 4.4$.

The size, shape, etc., of the p-type thermoelectric material and the n-type thermoelectric material used in the thermoelectric element are not limited. They may be suitably determined according to the size, shape, etc., of the desired thermoelectric module such that the desired thermoelectric performance is achieved. Examples thereof include rectangular parallelepiped-shaped materials having a width and thickness of about 1 mm to about 10 mm and a length of about 1 mm to about 20 mm, cylindrical materials having a length of about 1 mm to about 20 mm and a diameter of about 1 to about 10 mm, etc.

Such thermoelectric materials are obtained by molding the oxide powder, which is obtained in the same manner as the above-described method for producing the oxide powder for connecting thermoelectric materials, heating the molded doxide powder to provide a sintered product, when necessary, cutting the sintered product to a predetermined shape with a diamond cutter or the like, and shaping the product.

Any sintering methods can be employed insofar a dense sintered product can be obtained. Examples of such sintering methods include hot-press sintering method, partial melt method, etc. Sintering may be conducted in an oxidizing atmosphere such as in air or in a vacuum atmosphere but is not limited thereto. The sintering temperature is not limited, and for example, sintering may be conducted at about 800° C. to about 950° C.

Usable as an electrically conductive substrate to which the p-type thermoelectric material and the n-type thermoelectric material are each connected are an electrically conductive ceramic substrate, a substrate having a metal film formed on an insulative ceramics, etc.

Such an electrically conductive ceramics is preferably a material that does not deteriorate in high-temperature air at about 1073 K (absolute temperature), and that can maintain low electrical resistance over a long period of time. For example, a sintered oxide body with a low electrical resistivity, such as $LaNiO_3$, which is an n-type thermoelectric material, etc., can be used.

The insulative ceramics is preferably a material that does not oxidize in high-temperature air at about 1073 K. For example, a substrate formed of an oxide ceramics such as alumina may be used. The metal film formed on the insulative ceramics is not limited insofar as it is not oxidized in high-temperature air and has low electrical resistance. Such metal film may be formed of, for example, noble metals such as silver, gold, platinum, etc. by the vapor deposition method, etc.

The length, width, thickness, etc., of the electrically conductive substrate may be suitably determined according to module size, electrical resistance, etc. In view of the thermal history of the thermoelectric element and the thermoelectric generation module, it is preferable that the thermal expansion coefficient of the electrically conductive substrate be close to the thermal expansion coefficient of the thermoelectric material. Moreover, in order to efficiently transfer heat from a heat source to the high-temperature side of a thermoelectric element and to efficiently release heat from the low-temperature side, it is desirable to choose a substrate made of material with high thermal conductivity or to make the substrate thin.

FIG. 1 schematically shows a thermoelectric element of the invention in which one end of a p-type thermoelectric material and one end of an n-type thermoelectric material are connected to an electrically conductive substrate.

The pastes for connecting the p-type thermoelectric material and the n-type thermoelectric material to the electrically conductive substrate may be the same. Alternatively, the above-mentioned electrically conductive paste for connecting p-type thermoelectric materials may be used when a p-type thermoelectric material is connected to the electrically conductive substrate and the above-mentioned electrically conductive paste for connecting n-type thermoelectric materials may be used when an n-type thermoelectric material is connected the electrically conductive substrate. The specific composition of these electrically conductive pastes may be determined according to the desired mechanical strength, contact resistance, etc. of the connecting portion of the thermoelectric element or thermoelectric module. Since the thermal expansion coefficient of a thermoelectric material or electrically conductive substrate varies with its composition, the composition, amount, etc. of complex oxide(s) to be mixed in the electrically conductive paste may be determined according to the thermoelectric material or electrically conductive substrate used. In view of the mechanical and electrical properties, etc. of the connecting portion, the electrically conductive pastes may comprise two or more oxide powders. Considering the reaction between the thermoelectric material and the oxide powder(s) in the electrically conductive paste, it is particularly preferable to use an oxide powder(s) with the same constituent elements as those of the thermoelectric material to which the paste is applied for connection.

The connection method may be the same as conventional methods using a noble metal paste. To be specific, each of the p-type thermoelectric material and the n-type thermoelectric material can be connected to the electrically conductive substrate by applying the electrically conductive paste for connecting thermoelectric materials to the connecting portion between the thermoelectric material and the electrically conductive substrate, and drying and heating the electrically conductive paste to solidify it.

The amount of paste is not limited, and may be suitably determined according to the specific composition, etc. of the paste to be applied in such a manner that the thermoelectric material can be connected to the electrically conductive substrate with sufficient strength. For example, the paste is uniformly applied to the connecting portion in such a manner that the thickness of paste before solidification is about 10 μm to 500 μm and the thickness of the paste layer after solidification is about 1 μm to 200 μm.

The heating conditions are not limited, and are usually such that heating is conducted at about 80° C. to about 200° C. to thereby evaporate the organic solvent, and then heating is further conducted at about 500° C. to about 900° C. for about 5 minutes to about 1 hour to fix glass ingredients. At the time of connection, in order to tightly connect the thermoelectric material to the substrate, the electrically conductive paste may be solidified under pressure.

Thermoelectric Module

The thermoelectric module of the invention comprises a plurality of the above-described thermoelectric elements, wherein the thermoelectric elements are connected in series such that an unbonded end portion of a p-type thermoelectric material of one thermoelectric element is connected to an unbonded end portion of an n-type thermoelectric material of another thermoelectric element.

In general, on a substrate, an end portion of the p-type thermoelectric material of one thermoelectric element is connected to an end portion of the n-type thermoelectric material of another thermoelectric element by connecting unbonded end portions of the thermoelectric elements to the substrate with a binder.

FIG. 2 schematically shows one embodiment of a thermoelectric module in which a plurality of thermoelectric elements are connected on a substrate to one another using a binder.

The thermoelectric module of FIG. 2 is obtained by placing a plurality of the above-described thermoelectric elements on a substrate in such a manner that an unbonded end portion of a p-type thermoelectric material and an unbonded end portion of an n-type thermoelectric material of each thermoelectric element are in contact with the substrate, and adhering the plurality of thermoelectric elements to the substrate in such a manner that the p-type thermoelectric material of one thermoelectric element and the n-type thermoelectric material of another thermoelectric element are connected in series.

The main purpose of using a substrate for the thermoelectric module is to improve the thermal uniformity and/or mechanical strength and to maintain electrically insulative properties, etc. The properties of a material for the substrate are not limited, and it is preferable to use for the substrate a material which does not melt and is not damaged at high temperatures of at least about 675 K, is chemically stable, is an electrically insulative material, does not react with the thermoelectric materials or the binder, and has a favorable thermal conductivity. By using a highly thermally conductive substrate, the temperature of the high-temperature side of the element can be made close to that of the high-temperature heat source, thereby generating a high voltage. Since the thermoelectric material used in the invention is an oxide, oxide ceramics, such as alumina, etc., are preferable as substrate materials considering thermal expansion, etc.

It is preferable to use binders capable of connecting the thermoelectric element to the substrate while maintaining low electrical resistance. For example, pastes containing the noble metals, such as gold, silver, and platinum, solders, etc., can be suitably used. Also usable are pastes whose thermal expansion coefficient is made close to that of the thermoelectric material by adding an electrically conductive oxide powder to a noble-metal containing paste. Such pasts can prevent the separation at the connecting portion even when high-temperature power generation is repeated. It is possible to use an oxide powder to be mixed in the electrically conductive paste for connecting p-type thermoelectric materials or in the electrically conductive paste for connecting n-type thermoelectric materials.

The number of the thermoelectric elements used in one module is not limited, and can be suitably determined depending on the required electric power. FIG. 2 schematically shows the structure of a module comprising 84 thermoelectric elements. The output of the module is approximately equivalent to the value obtained by multiplying the output of each thermoelectric element by the number of the thermoelectric elements used.

The thermoelectric module of the invention can produce a difference in electrical potential by positioning one side thereof at a high-temperature environment and another side thereof at a low-temperature environment. For example, in the module of FIG. 2, the substrate is disposed at a high-temperature environment and the other side is disposed at a low-temperature environment. Note that the positioning manner of the thermoelectric module of the invention is not limited to the above, and all that is required is to position one side at a high-temperature environment and the other side at a low-temperature environment. For example, in the module of FIG. 2, the high-temperature environment and the low-temperature environment can be reversed.

As described above, by electrically connecting a thermoelectric material to an electrically conductive substrate using the electrically conductive paste of the present invention, a suitable electroconductivity is imparted to the connecting portion of the thermoelectric material and the thermal expansion coefficient of the connecting portion can be made close to that of the thermoelectric material. Thus, even when high-temperature power generation is repeated, separation at the connecting portion is prevented and a favorable thermoelectric performance can be maintained.

Accordingly, the present invention can provide a thermoelectric element with excellent performance comprising thermoelectric materials with high thermoelectric conversion efficiency as well as excellent thermal stability, chemical durability, etc.

The thermoelectric module containing such thermoelectric elements have excellent thermal stability. Therefore, even when the high-temperature portion is rapidly cooled from high temperatures of about 1000 K to room temperature, the module is not damaged and the power generation characteristics thereof are not likely to deteriorate.

As described above, since the thermoelectric module of the invention has high output power density even in a small size and high thermal shock resistance, the thermoelectric module can achieve thermoelectric generation utilizing, as a heat source, high temperature heat of at least 473 K generated in industrial plants, garbage-incineration facilities, thermal power stations, atomic power stations, microturbines, etc.

Moreover, the thermoelectric module of the invention can be applied to an electrical power source of automobile, in which temperatures rapidly change.

Moreover, since the thermoelectric module can also generate electricity from heat energy of about 473 K or lower, low-temperature heat of about 293 K to about 473 K, such as solar heat, boiling water, body temperature, etc. can be utilized as a heat source. Thus, providing a suitable heat source to the thermoelectric module of the invention allows the application thereof to a power supply which does not require recharging for use in portable equipment such as mobile phones, laptop computers, etc.

EXAMPLES

Figure 1:
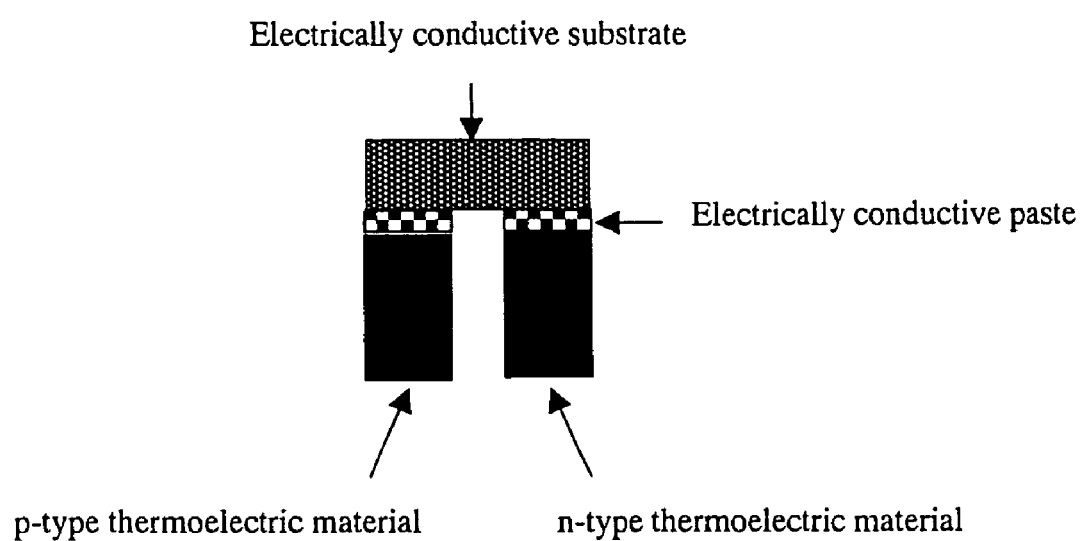
FIG. 1 schematically shows one embodiment of a thermoelectric element formed by connecting thermoelectric materials to an electrically conductive material with an electrically conductive paste.
Figure 2:
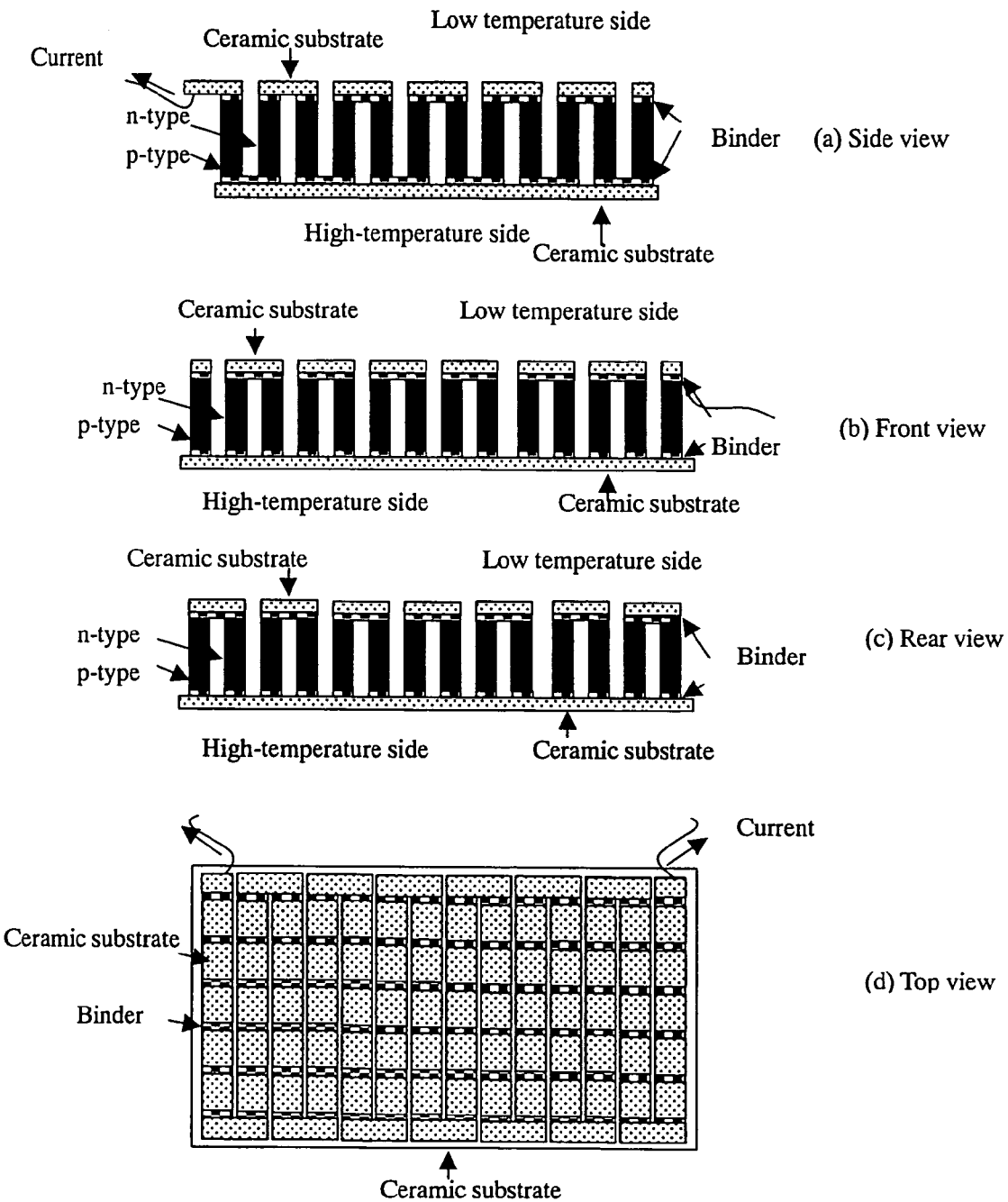
FIG. 2 schematically shows a thermoelectric module with a plurality of thermoelectric elements being connected on a substrate.

Hereinafter, the present invention is described in more detail with reference to the following Examples.

Example 1

Production of P-Type Thermoelectric Material

A p-type thermoelectric material represented by the formula $Ca_{2.7}Bi_{0.3}Co_4O_{9.2}$ was produced according to the following method.

Initially, calcium carbonate ($CaCO_3$), bismuth oxide ($Bi_2O_3$), and cobalt oxide ($Co_3O_4$) were weighed out in such a manner as to yield a Ca:Bi:Co ratio (atomic ratio) of 2.7:0.3:4 and thoroughly mixed. The mixture was placed into an alumina crucible and calcined in air at 1073 K (800° C.) for 10 hours. The calcinate was sufficiently mixed using an agate mortar and pestle.

The obtained powder was molded by pressing into a disk-like form with a diameter of 20 mm and thickness of about 2 mm to about 10 mm. The molded body was placed on a gold sheet laid on an alumina boat, and sintered in a 300 ml/minute oxygen stream at 1153 k (880° C.) for 20 hours. The sintered body thus obtained was crushed using an agate mortar and pestle.

The powder thus obtained was molded by pressing into a plate-like form with each side being 30 mm and a thickness of 5 mm, followed by hot-press sintering at 1123 K (850° C.) in air under uniaxial pressure of 10 MPa for 20 hours. The hot-pressed sintered body was cut and formed into a rectangular parallelepiped which has a surface of 4 mm×4 mm perpendicular to the pressed surface and a length of 5 mm in parallel to the pressed surface, thereby producing a p-type thermoelectric material.

Production of N-Type Thermoelectric Material

An n-type thermoelectric material represented by the formula $La_{0.9}Bi_{0.1}NiO_{3.1}$ was produced according to the following method.

Initially, lanthanum nitrate ($La(No_3)_3 \cdot 6H_2O$), bismuth nitrate ($Bi(No_3)_3 \cdot 5H_2O$), and nickel nitrate ($Ni(No_3)_2 \cdot 6H_2O$) were weighed out in such a manner as to yield a La:Bi:Ni ratio (atomic ratio) of 0.9:0.1:1.0, and completely dissolved in distilled water in a crucible of alumina, followed by mixing. The obtained aqueous solution was stirred using a magnetic stirrer to evaporate water for solidification.

The obtained solid was heated at 1073 K (800° C.) in air for 10 hours to thermally decompose the nitrate. The obtained calcinate was mixed using an agate mortar and pestle.

The obtained powder was molded by pressing into a disk-like form with a diameter of 2 cm and thickness of about 2 mm to about 10 mm. The molded body was placed on a platinum sheet laid on an alumina boat, followed by sintering in a 300 ml/minute oxygen stream at 1273 k (1000° C.) for 20 hours. The sintered body thus obtained was crushed using an agate mortar and pestle. The powder obtained was again molded by pressing to have the same dimension as mentioned previously, and sintered under the same conditions. The sintered body was crushed using an agate mortar and pestle.

The powder thus obtained was molded by pressing into a plate-like form with each side being 30 mm and a thickness of 5 mm, followed by hot-press sintering at 1173 K (950° C.) in air under uniaxial pressure of 10 MPa for 20 hours. The hot-pressed sintered body was cut and formed into a rectangular parallelepiped which has a surface of 4 mm×4 mm perpendicular to the pressed surface and a length of 5 mm in parallel to the pressed surface, thereby producing an n-type thermoelectric material.

Preparation of Electrically Conductive Paste for Connecting P-Type Thermoelectric Materials In the above-described process for producing a p-type thermoelectric material, the powder obtained by crushing the sintered body obtained by sintering at 1153 K (880° C.) for 20 hours was further crushed in a ball mill using an agate pot and ball for 10 minuets. The observation of the obtained oxide powder with a scanning electron microscope showed that the diameter of 80% or more of particles was within the range of 1 μm to 10 μm.

This oxide powder was mixed in a commercially-available silver paste (trade name: H-4215, manufactured by Shoei Chemical Inc.), preparing an electrically conductive paste for connecting p-type thermoelectric materials. Used was a silver paste comprising 85% by weight of silver powder (particle diameter of about 0.1 μm to about 5 μm), 1% by weight of borosilicate bismuth glass, 5% by weight of ethyl cellulose, 4% by weight of terpineol, and 5% by weight of butylcarbitol acetate. The amount of the oxide powder was 6.25 parts by weight per 100 parts by weight of the silver powder of the silver paste.

Preparation of Electrically Conductive Paste for Connecting N-Type Thermoelectric Materials In the above-described process for producing an n-type thermoelectric material, the powder obtained by conducting twice the process of sintering at 1273 K (1000° C.) for 20 hours and crushing was further crushed in a ball mill using an agate pot and ball for 10 minuets. The observation of the obtained oxide powder with a scanning electron microscope showed that the particle diameter of 80% or more of particles was within the range of 1 μm to 10 μm.

This oxide powder was mixed in a commercially-available silver paste, preparing an electrically conductive paste for connecting n-type thermoelectric materials. The type and amount of silver paste were the same as in the electrically conductive paste for connecting p-type thermoelectric materials.

Production of Thermoelectric Element

A thermoelectric element comprising a pair of a p-type thermoelectric material and an n-type thermoelectric material was produced by connecting the p-type thermoelectric material and the n-type thermoelectric material to an electrically conductive substrate.

Used as an electrically conductive substrate was a substrate with an electrically conductive film made from silver paste. The substrate was obtained by applying the silver paste to a 5 mm×8 mm aluminum plate having a thickness of 1 mm on the 5 mm×8 mm surface, and then drying the paste.

The above-described electrically conductive paste for connecting p-type thermoelectric materials and the electrically conductive paste for connecting n-type thermoelectric materials were applied to the 4 mm×4 mm surface of the p-type thermoelectric material and the 4 mm×4 mm surface of the n-type thermoelectric material, respectively. The p-type thermoelectric material and n-type thermoelectric material were disposed on the alumina substrate in such a manner that the surface of each thermoelectric material with the electrically conductive paste was in contact with the surface of the alumina substrate whose surface was coated with the silver film. The resultant was heated at 373 K (100° C.) for about 10 to about 30 minutes, and further heated at 1073 K (800° C.) in air for about 15 minutes to dry the electrically conductive paste for solidification.

The amount of paste was such that the thickness of the paste before solidification was about 50 μm. The thickness of the paste layer after solidification was 20 μm.

Figure 3:
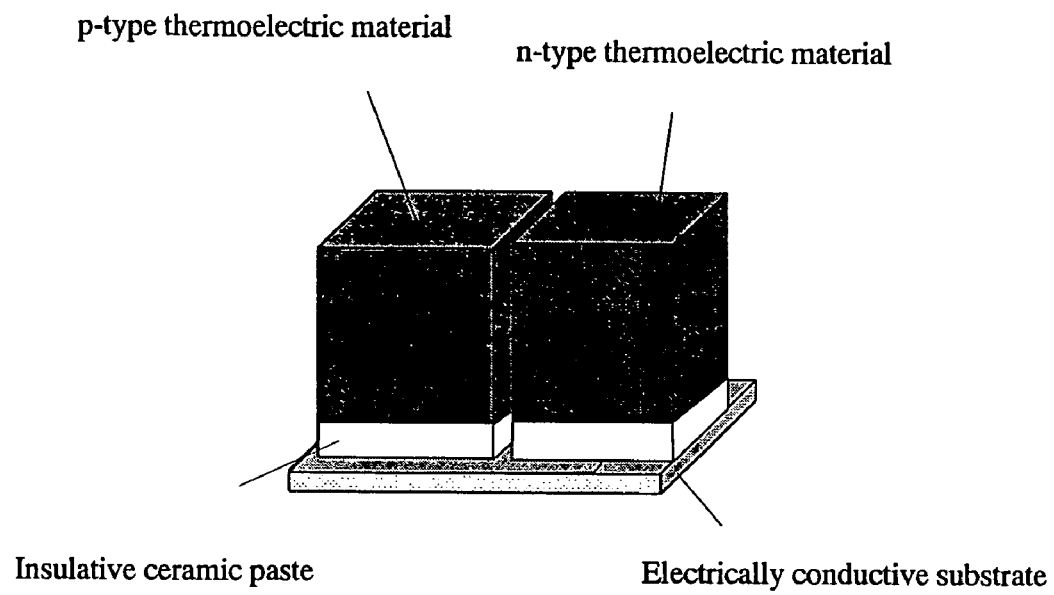
FIG. 3 schematically shows the thermoelectric element of Example 1.

Subsequently, in order to reinforce the connecting portion of the substrate and each thermoelectric material, an insulative ceramic paste comprising alumina as a main ingredient was applied around each connecting portion, and dried, preparing a thermoelectric element. FIG. 3 schematically shows the thermoelectric element thus obtained.

Test Results

For the thermoelectric element obtained according to the above-described method, the open-circuit voltage (Vo) and electrical resistance (Ro) were measured under the conditions where the substrate of the element was heated to 328 K to 1123 K (55° C. to 850° C.) using an electric furnace and the opposite end of the element was cooled using a cooler in such a manner that the temperature difference between the substrate and the opposite end was 303 K to 773K (30° C. to 500° C.). The term "open-circuit voltage" used herein refers to the voltage produced between the low-temperature portion of the p-type thermoelectric material and the low-temperature portion of the n-type thermoelectric material by creating a temperature difference in the thermoelectric element without connecting external resistance (load).

Separately, as Comparative Example, for thermoelectric element obtained in the same manner as in Example 1 except that a commercially-available silver paste was used by itself with no oxide powder being mixed as each of the electrically conductive paste for connecting p-type thermoelectric materials and the electrically conductive paste for connecting n-type thermoelectric materials, the open-circuit voltage Vo and electrical resistance Ro were measured in the similar manner as above.

Figure 4:
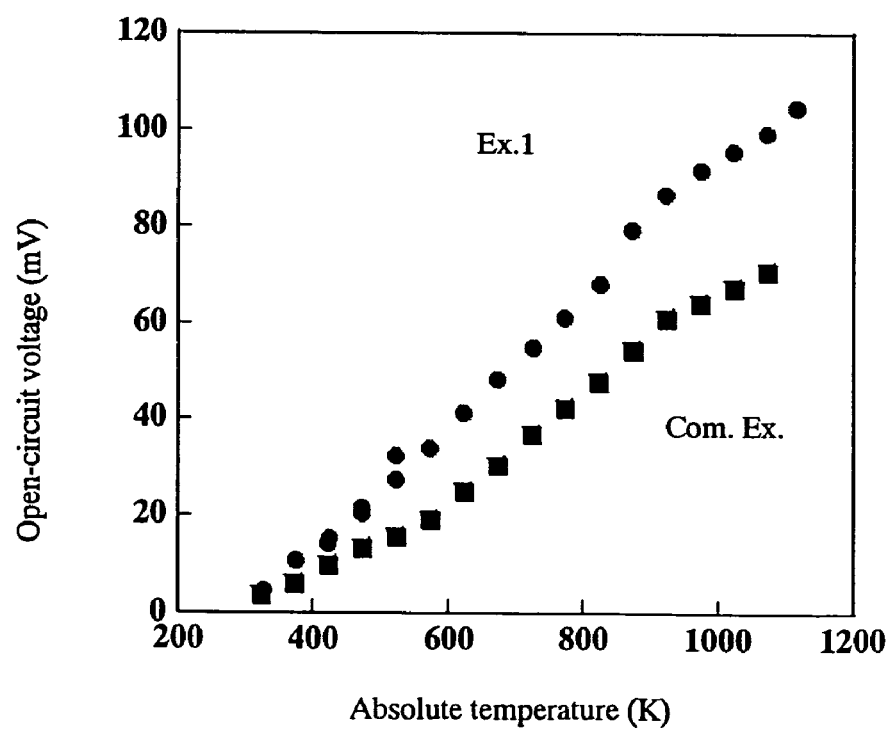
FIG. 4 is a chart showing the relationship between the open-circuit voltage (Vo) and the temperature of the substrate (high temperature portion) of each thermoelectric element of Example 1 and Comparative Example 1.

FIG. 4 is a chart showing the relationship between the open-circuit voltage Vo and the temperature of the substrate (high temperature portion). FIG. 4 shows that the open-circuit voltage tends to increase with the increase in the temperature of the high-temperature portion. This possibly results from the fact that the temperature difference between the high-temperature portion and the low-temperature portion can be enlarged with the increase in the temperature of the high-temperature portion and moreover the absolute values of an Seebeck coefficient of the thermoelectric materials used tend to increase with the rise in the temperature. Such tendencies were seen in all of Examples described later.

When the temperature of the high-temperature portion was adjusted to 1073 K to obtain 490 K temperature difference between the high-temperature portion and the low-temperature portion, the open-circuit voltage in Example 1 was 100 mV while that in Comparative Example was lower, i.e., 70 mV. Such a difference in the open-circuit voltages possibly results from the fact that, in Comparative Example, some of the thermoelectric materials were separated at the interface of the connecting portion because silver paste was used for connecting the thermoelectric materials, which produced a difference in the coefficient of thermal expansion between the silver and the thermoelectric material, and while, in Example 1, the separation at the connecting portion was not likely to occur because a specific oxide powder was mixed in the electrically conductive paste, which made the coefficient of thermal expansion of the connecting portion close to that of the thermoelectric material.

Figure 5:
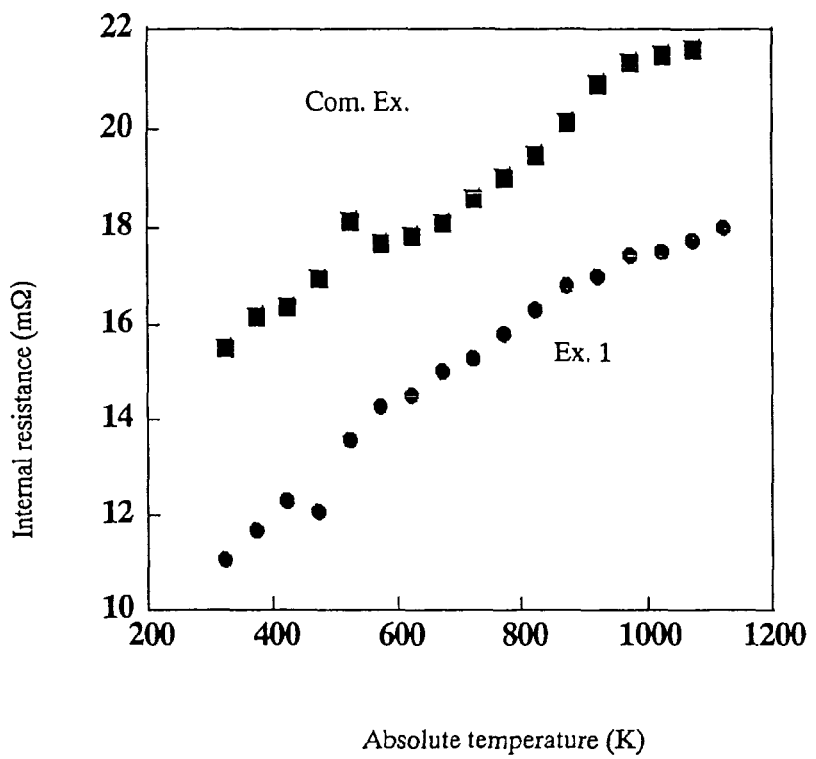
FIG. 5 is a chart showing the relationship between the internal resistance (Ro) and the temperature of the substrate (high temperature portion) of each thermoelectric element of Example 1 and Comparative Example.

FIG. 5 is a chart showing the relationship between the internal resistance Ro and the temperature of the substrate (high-temperature portion). Over the entire temperature range for measurement, the internal resistance of the element of Example 1 is lower than that of the element of Comparative Example. Such a difference possibly results from the fact that, in the element of Example 1, the separation of the thermoelectric material was prevented and moreover the resistance of each interface between the connecting portion and the thermoelectric material was reduced by mixing a specific oxide powder in the electrically conductive paste.

Figure 6:
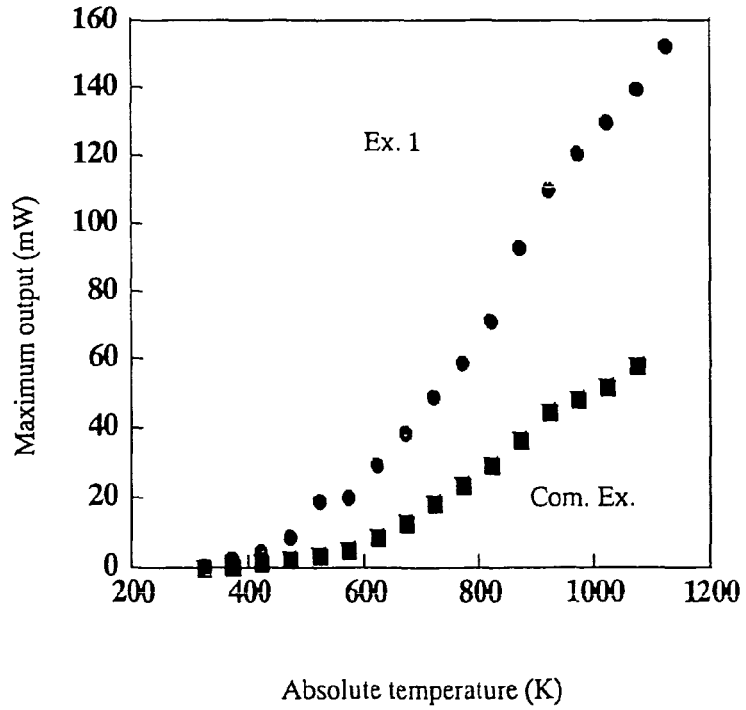
FIG. 6 is a chart showing the relationship between the maximum output and the temperature of the substrate (high temperature portion) of each thermoelectric element of Example 1 and Comparative Example.

In general, when an output is obtained by connecting an external resistance to a power source, the maximum output is obtained when the external resistance is the same as the internal resistance of the power source. In that case, the current Io flowing through the external resistance is Vo/2Ro, and the obtainable output Pmax (=Imax$^2$Ro) is Vo$^2$/4Ro. FIG. 6 is a chart showing the relationship between the temperature of a high-temperature portion (substrate) and the maximum output calculated based on the open-circuit voltage Vo and the internal voltage Ro. It is found that the element of Example 1 can obtain higher outputs as compared with the element of Comparative Example.

Figure 7:
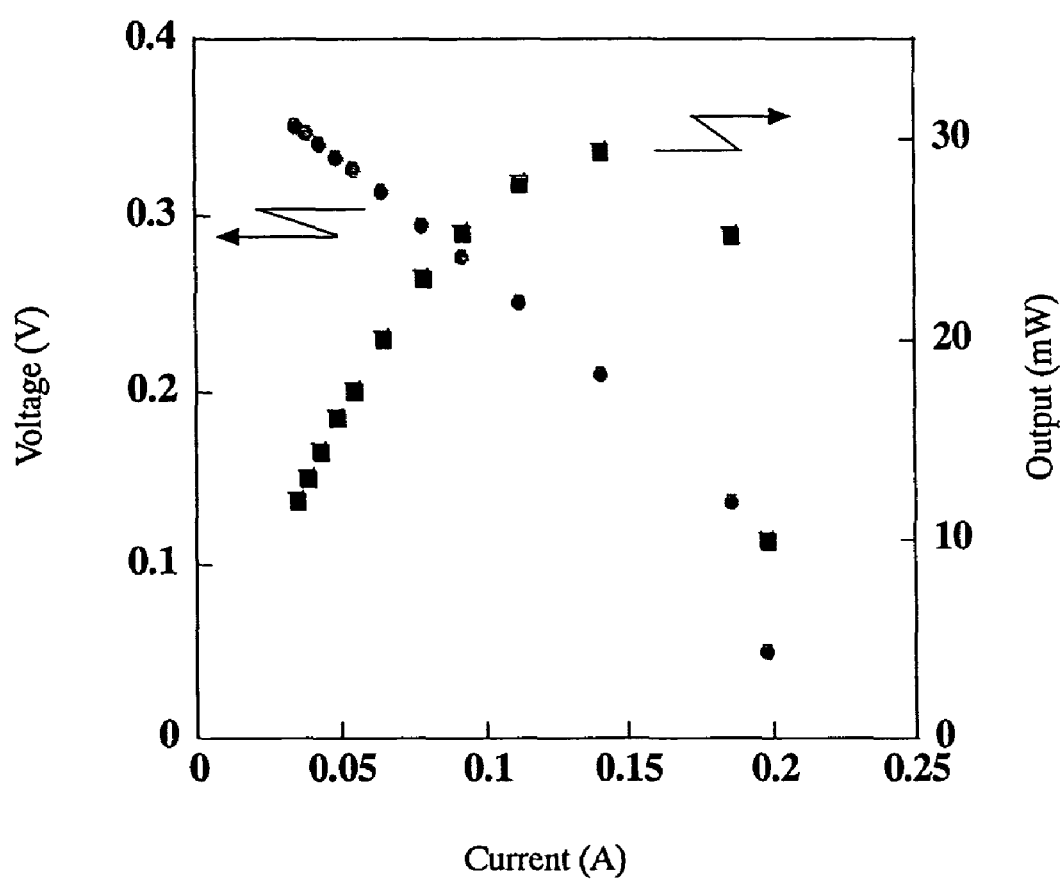
FIG. 7 is a chart showing power generation characteristics of a thermoelectric module containing the thermoelectric elements of Example 1.

FIG. 7 is a chart showing the power generation characteristics of a thermoelectric module comprising 10 thermoelectric elements obtained in Example 1. Although outputs as estimated from the results of FIG. 6 were not obtained, it was proved that thermoelectric generation using this module can effect the operation of a small motor.

Examples 2 to 94

Thermoelectric elements were produced in the same manner as in Example 1 except that the materials represented by the formulae in Tables 1 to 7 were used as oxide powder(s) to be mixed in the electrically conductive pastes for connecting p-type thermoelectric materials; oxide powder to be mixed in the electrically conductive pastes for connecting n-type thermoelectric materials; p-type thermoelectric materials; and n-type thermoelectric materials. The thermoelectric performance of the thermoelectric elements obtained was evaluated. In each Table, the amount of oxide powder to be mixed in the electrically conductive paste is expressed in parts by weight per 100 parts by weight of silver powder.

Each Table shows open-circuit voltages measured when the temperatures of the high-temperature portion and the low temperature portion were 973 K and 500 K, respectively, and inner resistances measured when the temperature of the high-temperature portion was 973K. The thermoelectric elements of all of the Examples exhibited more excellent open-circuit voltages and inner resistances as compared with those of thermoelectric elements formed by connecting thermoelectric materials of the same compositions as Examples 2 to 94 with silver paste.

TABLE 1

| Examples (No.) | Thermoelectric material p-type material/n-type material | Electrically conductive paste Powder for p-type material (parts by weight)/Powder for n-type Metal material (parts by weight) | Open-circuit voltage (mV) | Electrical resistance (mΩ) |
|---|---|---|---|---|
| 1 | $Ca_{2.7}Bi_{0.3}Co_4O_{9.2}/La_{0.9}Bi_{0.1}NiO_{3.1}$ | Silver $Ca_{2.7}Bi_{0.3}Co_4O_{9.2}$ (6.25)/ $La_{0.9}Bi_{0.1}NiO_{3.1}$ (6.25) | 100 | 21 |
| 2 | $Ca_{2.7}Bi_{0.3}Co_4O_{9.2}/La_{0.7}Bi_{0.3}NiO_{3.3}$ | Silver $Ca_{2.7}Bi_{0.3}Co_4O_{9.2}$ (2.0)/ $La_{0.7}Bi_{0.3}NiO_{3.3}$ (2.0) | 98 | 22 |
| 3 | $Ca_{3.3}Bi_{0.5}Co_4O_{10}/La_{0.9}Bi_{0.1}NiO_{3.1}$ | Silver $Ca_{3.3}Bi_{0.5}Co_4O_{10}$ (6.25)/ $La_{0.9}Bi_{0.1}NiO_{3.1}$ (6.25) | 100 | 20 |
| 4 | $Ca_{2.7}Na_{0.3}Co_4O_{8.5}/La_{0.5}NiO_{2.7}$ | Silver $Ca_{2.7}Na_{0.3}Co_4O_{8.5}$ (6.25)/ $La_{0.5}Na_{0.5}NiO_{2.7}$ (6.25) | 98 | 23 |
| 5 | $Ca_{2.7}K_{0.3}Co_4O_{8.4}/La_{0.5}K_{0.5}NiO_{2.8}$ | Silver $Ca_{2.7}K_{0.3}Co_4O_{8.4}$ (2.0)/ $La_{0.5}K_{0.5}NiO_{2.8}$ (2.0) | 95 | 25 |
| 6 | $Ca_{2.7}Li_{0.3}Co_4O_8/La_{0.5}Sr_{0.5}NiO_{2.9}$ | Silver $Ca_{2.7}Bi_{0.3}Co_4O_9$ (6.25)/ $La_{0.5}Sr_{0.5}NiO_{2.9}$ (6.25) | 90 | 30 |
| 7 | $Ca_{2.7}Y_{0.3}Co_4O_{9.3}/La_{0.9}Bi_{0.1}NiO_{3.1}$ | Silver $Ca_{2.7}Y_{0.3}Co_4O_{9.3}$ (2.0)/ $La_{0.9}Bi_{0.1}NiO_{3.1}$ (2.0) | 90 | 28 |
| 8 | $Ca_{2.7}La_{0.3}Co_4O_{9.5}/LaNiO_{2.9}$ | Silver $Ca_{2.7}La_{0.3}Co_4O_{9.5}$ (6.25)/ $LaNiO_{2.9}$ (6.25) | 98 | 22 |
| 9 | $Ca_{2.7}La_{0.3}Co_4O_{9.5}/La_{1.2}NiO_{3.2}$ | Silver $Ca_{2.7}La_{0.3}Co_4O_{9.5}$ (2.0)/ $La_{1.2}NiO_{3.2}$ (2.0) | 96 | 24 |
| 10 | $Ca_{2.7}Ce_{0.3}Co_4O_{9.4}/La_{0.9}Bi_{0.1}NiO_{3.1}$ | Silver $Ca_{2.7}Ce_{0.3}Co_4O_{9.4}$ (6.25)/ $La_{0.9}Bi_{0.1}NiO_{3.1}$ (6.25) | 92 | 25 |
| 11 | $Ca_{2.7}Pr_{0.3}Co_4O_{9.4}/La_{0.9}Bi_{0.1}NiO_{3.1}$ | Silver $Ca_{2.7}Pr_{0.3}Co_4O_{9.4}$ (2.0)/ $La_{0.9}Bi_{0.1}NiO_{3.1}$ (2.0) | 94 | 24 |
| 12 | $Ca_{2.7}Nd_{0.3}Co_4O_{9.5}/La_{0.9}Bi_{0.1}NiO_{3.1}$ | Silver $Ca_{2.7}Nd_{0.3}Co_4O_{9.5}$ (6.25)/ $La_{0.9}Bi_{0.1}NiO_{3.1}$ (6.25) | 97 | 23 |
| 13 | $Ca_{2.7}Sm_{0.3}Co_4O_{9.5}/La_{0.9}Bi_{0.1}NiO_{3.1}$ | Silver $Ca_{2.7}Sm_{0.3}Co_4O_{9.5}$ (2.0)/ $La_{0.9}Bi_{0.1}NiO_{3.1}$ (2.0) | 98 | 22 |
| 14 | $Ca_{2.7}Eu_{0.3}Co_4O_{9.3}/La_{0.9}Bi_{0.1}NiO_{3.1}$ | Silver $Ca_{2.7}Eu_{0.3}Co_4O_{9.3}$ (6.25)/ $La_{0.9}Bi_{0.1}NiO_{3.1}$ (6.25) | 92 | 29 |
| 15 | $Ca_{2.7}Gd_{0.3}Co_4O_{9.2}/La_{0.9}Bi_{0.1}NiO_{3.1}$ | Silver $Ca_{2.7}Gd_{0.3}Co_4O_{9.2}$ (2.0)/ $La_{0.9}Bi_{0.1}NiO_{3.1}$ (2.0) | 95 | 23 |

TABLE 2

| Examples (No.) | Thermoelectric material p-type material/n-type material | Electrically conductive paste Powder for p-type material (parts by weight)/Powder for n-type Metal material (parts by weight) | Open-circuit voltage (mV) | Electrical resistance (mΩ) |
|---|---|---|---|---|
| 16 | $Ca_{2.7}Dy_{0.3}Co_4O_{9.5}/La_{0.9}Bi_{0.1}NiO_{3.1}$ | Silver $Ca_{2.7}Dy_{0.3}Co_4O_{9.5}$ (6.25)/ $La_{0.9}Bi_{0.1}NiO_{3.1}$ (6.25) | 91 | 24 |
| 17 | $Ca_{2.7}Ho_{0.3}Co_4O_{9.4}/La_{0.9}Bi_{0.1}NiO_{3.1}$ | Silver $Ca_{2.7}Ho_{0.3}Co_4O_{9.4}$ (2.0)/ $La_{0.9}Bi_{0.1}NiO_3$ (2.0) | 88 | 29 |
| 18 | $Ca_{2.7}Er_{0.3}Co_4O_{9.4}/La_{0.9}Bi_{0.1}NiO_{3.1}$ | Silver $Ca_{2.7}Er_{0.3}Co_4O_{9.4}$ (6.25)/ $La_{0.9}Bi_{0.1}NiO_{3.1}$ (6.25) | 90 | 28 |
| 19 | $Ca_{2.7}Yb_{0.3}Co_4O_{9.4}/La_{0.9}Bi_{0.1}NiO_{3.1}$ | Silver $Ca_{2.7}Yb_{0.3}Co_4O_{9.4}$ (2.0)/ $La_{0.9}Bi_{0.1}NiO_{3.1}$ (2.0) | 92 | 25 |
| 20 | $Ca_{2.2}Sr_{0.8}Co_4O_{8.8}/La_{0.8}Sr_{0.2}NiO_{3.1}$ | Silver $Ca_{2.2}Sr_{0.8}Co_4O_{8.8}$ (6.25)/ $La_{0.8}Sr_{0.2}NiO_{3.1}$ (6.25) | 97 | 24 |
| 21 | $Ca_3Co_4O_{9.2}/La_{0.8}Ca_{0.2}NiO_{3.1}$ | Silver $Ca_3Co_4O_{9.2}$ (2.0)/ $La_{0.8}Ca_{0.2}NiO_{3.1}$ (1.0) | 87 | 30 |
| 22 | $Ca_{3.6}Co_4O_{9.5}/La_{0.8}Ca_{0.2}NiO_{2.9}$ | Silver $Ca_{3.6}Co_4O_{9.5}$ (6.25)/ $La_{0.8}Ca_{0.2}NiO_3$ (1.0) | 85 | 30 |
| 23 | $Ca_{2.2}Bi_{0.4}Na_{0.4}Co_4O_{9.3}/La_{0.9}Bi_{0.1}NiO_{3.1}$ | Silver $Ca_{2.2}Bi_{0.4}Na_{0.4}Co_4O_{9.3}$ (2.0)/ $La_{0.9}Bi_{0.1}NiO_{3.1}$ (2.0) | 98 | 23 |
| 24 | $Ca_{2.2}Y_{0.4}Na_{0.4}Co_4O_{9.2}/La_{0.9}Bi_{0.1}NiO_{3.1}$ | Silver $Ca_{2.2}Y_{0.4}Na_{0.4}Co_4O_{9.2}$ (15)/ $La_{0.9}Bi_{0.1}NiO_{3.1}$ (15) | 92 | 27 |
| 25 | $Ca_{2.2}La_{0.4}Na_{0.4}Co_4O_{9.2}/La_{0.9}Bi_{0.1}NiO_3$ | Silver $Ca_{2.2}La_{0.4}Na_{0.4}Co_4O_{9.2}$ (6.25)/ $La_{0.9}Bi_{0.1}NiO_3$ (6.25) | 93 | 28 |

TABLE 2-continued

| Examples (No.) | Thermoelectric material p-type material/n-type material | Electrically conductive paste Powder for p-type material (parts by weight)/Powder for n-type Metal material (parts by weight) | Open-circuit voltage (mV) | Electrical resistance (mΩ) |
|---|---|---|---|---|
| 26 | $Ca_{2.2}Ce_{0.4}Na_{0.4}Co_4O_{9.5}/La_{0.9}Bi_{0.1}NiO_{3.1}$ | Silver $Ca_{2.2}Ce_{0.4}Na_{0.4}Co_4O_{9.5}$ (15)/ $La_{0.9}Bi_{0.1}NiO_{3.1}$ (1.0) | 89 | 31 |
| 27 | $Ca_{2.2}Pr_{0.4}Na_{0.4}Co_4O_{9.3}/La_{0.9}Bi_{0.1}NiO_{3.1}$ | Silver $Ca_{2.2}Pr_{0.4}Na_{0.4}Co_4O_{9.3}$ (2.0)/ $La_{0.9}Bi_{0.1}NiO_{3.1}$ (2.0) | 89 | 32 |
| 28 | $Ca_{2.2}Nd_{0.4}Na_{0.4}Co_4O_{9.2}/La_{0.9}Bi_{0.1}NiO_{3.1}$ | Silver $Ca_{2.2}Nd_{0.4}Na_{0.4}Co_4O_{9.2}$ (6.25)/ $La_{0.9}Bi_{0.1}NiO_{3.1}$ (6.25) | 92 | 27 |
| 29 | $Ca_{2.2}Sm_{0.4}Na_{0.4}Co_4O_{9.4}/La_{0.9}Bi_{0.1}NiO_{3.1}$ | Silver $Ca_{2.2}Sm_{0.4}Na_{0.4}Co_4O_{9.4}$ (2.0)/ $La_{0.9}Bi_{0.1}NiO_{3.1}$ (2.0) | 90 | 28 |
| 30 | $Ca_{2.2}Eu_{0.4}Na_{0.4}Co_4O_{9.4}/La_{0.9}Bi_{0.1}NiO_{3.1}$ | Silver $Ca_{2.2}Eu_{0.4}Na_{0.4}Co_4O_{9.4}$ (6.25)/ $La_{0.9}Bi_{0.1}NiO_{3.1}$ (6.25) | 88 | 32 |

TABLE 3

| Examples (No.) | Thermoelectric material p-type material/n-type material | Electrically conductive paste Powder for p-type material (parts by weight)/Powder for n-type Metal material (parts by weight) | Open-circuit voltage (mV) | Electrical resistance (mΩ) |
|---|---|---|---|---|
| 31 | $Ca_{2.2}Gd_{0.3}Na_{0.4}Co_4O_{9.4}/La_{0.9}Bi_{0.1}NiO_{3.1}$ | Silver $Ca_{2.2}Gd_{0.3}Na_{0.4}Co_4O_{9.4}$ (2.0)/ $La_{0.9}Bi_{0.1}NiO_{3.1}$ (1.5) | 92 | 26 |
| 32 | $Ca_{2.2}Dy_{0.4}Na_{0.4}Co_4O_{9.2}/La_{0.9}Bi_{0.1}NiO_{3.1}$ | Silver $Ca_{2.2}Dy_{0.4}Na_{0.4}Co_4O_{9.2}$ (6.25)/ $La_{0.9}Bi_{0.1}NiO_{3.1}$ (6.25) | 90 | 27 |
| 33 | $Ca_{2.2}Ho_{0.1}Na_{0.4}Co_4O_{9.3}/La_{0.9}Bi_{0.1}NiO_{3.1}$ | Silver $Ca_{2.2}Ho_{0.4}Na_{0.4}Co_4O_{9.3}$ (2.0)/ $La_{0.9}Bi_{0.1}NiO_{3.1}$ (1.5) | 88 | 29 |
| 34 | $Ca_{2.2}Er_{0.4}Na_{0.4}Co_4O_{9.2}/La_{0.9}Bi_{0.1}NiO_{3.1}$ | Silver $Ca_{2.2}Er_{0.4}Na_{0.4}Co_4O_{9.2}$ (6.25)/ $La_{0.9}Bi_{0.1}NiO_{3.1}$ (6.25) | 89 | 32 |
| 35 | $Ca_{2.2}Yb_{0.4}Na_{0.4}Co_4O_{9.4}/La_{0.9}Bi_{0.1}NiO_{3.1}$ | Silver $Ca_{2.2}Yb_{0.4}Na_{0.4}Co_4O_{9.4}$ (2.0)/ $La_{0.9}Bi_{0.1}NiO_{3.1}$ (2.0) | 90 | 26 |
| 36 | $Bi_2Sr_2Co_2O_{9.1}/La_{0.9}Sri_{0.1}NiO_{3.1}$ | Silver $Bi_2Sr_2Co_2O_{9.1}$ (6.25)/ $La_{0.9}Sri_{0.1}NiO_{3.1}$ (6.25) | 100 | 32 |
| 37 | $Bi_{2.2}Sr_{1.8}Co_2O_{8.5}/La_{0.9}Bi_{0.1}NiO_{3.1}$ | Silver $Bi_{2.2}Sr_{1.8}Co_2O_{8.5}$ (6.25)/ $La_{0.9}Bi_{0.1}NiO_{3.1}$ (6.25) | 98 | 35 |
| 38 | $Bi_{1.8}Pb_{0.2}Sr_{1.8}Co_2O_8/La_{0.5}Na_{0.5}NiO_{2.7}$ | Silver $Bi_{1.8}Pb_{0.2}Sr_{1.8}Co_2O_8$ (6.25)/ $La_{0.5}Na_{0.5}NiO_{2.7}$ (6.25) | 97 | 33 |
| 39 | $Bi_{1.8}Pb_{0.4}Sr_{2.2}Co_2O_{9.6}/La_{0.5}K_{0.5}NiO_{2.8}$ | Silver $Bi_{1.8}Pb_{0.4}Sr_{2.2}Co_2O_{9.6}$ (6.25)/ $La_{0.5}K_{0.5}NiO_{2.8}$ (6.25) | 98 | 35 |
| 40 | $Bi_2Ca_2Co_2O_{9.1}/La_{0.5}Ca_{0.5}NiO_{2.7}$ | Silver $Bi_2Ca_2Co_2O_{9.1}$ (6.25)/ $La_{0.5}Ca_{0.5}NiO_{2.7}$ (6.25) | 90 | 38 |
| 41 | $Bi_{2.2}Ca_{1.8}Co_2O_{9.5}/La_{0.9}Bi_{0.1}NiO_{3.1}$ | Silver $Bi_{2.2}Ca_{1.8}Co_2O_{9.5}$ (6.25)/ $La_{0.9}Bi_{0.1}NiO_{3.1}$ (6.25) | 92 | 36 |
| 42 | $Bi_{1.8}Pb_{0.2}Ca_2Co_2O_{8.9}/LaNiO_{7.9}$ | Silver $Bi_{1.8}Pb_{0.2}Ca_2Co_2O_{8.9}$ (6.25)/ $LaNiO_{7.9}$ (6.25) | 94 | 35 |
| 43 | $Bi_{1.8}Pb_{0.4}Ca_{2.2}Co_2O_{9.4}/LaNiO_{2.9}$ | Silver $Bi_{1.8}Pb_{0.4}Ca_{2.2}Co_2O_{9.4}$ (6.25)/ $LaNiO_{2.9}$ (6.25) | 92 | 36 |
| 44 | $Bi_2Ba_2Co_2O_9/La_{0.9}Bi_{0.1}NiO_{3.1}$ | Silver $Bi_2Ba_2Co_2O_9$ (6.25)/ $La_{0.9}Bo_{0.1}NiO_{3.1}$ (6.25) | 80 | 42 |
| 45 | $Bi_{2.2}Ba_2Co_2O_{10}/La_{0.9}Bi_{0.1}NiO_{3.1}$ | Silver $Bi_{2.2}Ba_2Co_2O_{10}$ (6.25)/ $La_{0.9}Bi_{0.1}NiO_{3.1}$ (6.25) | 87 | 40 |

TABLE 4

| Examples (No.) | Thermoelectric material p-type material/n-type material | Electrically conductive paste Powder for p-type material (parts by weight)/Powder for n-type Metal material (parts by weight) | Open-circuit voltage (mV) | Electrical resistance (mΩ) |
|---|---|---|---|---|
| 46 | $Bi_{1.8}Pb_{0.2}Ba_2Co_2O_{9.2}/La_{0.9}Bi_{0.1}NiO_{3.1}$ | Silver $Bi_{1.8}Pb_{0.2}Ba_2Co_2O_{9.2}$ (6.25)/ $La_{0.9}Bi_{0.1}NiO_{3.1}$ (6.25) | 90 | 39 |
| 47 | $Bi_{1.8}Pb_{0.4}Ba_{2.2}Co_2O_{9.5}/La_{0.9}Bi_{0.1}NiO_{3.1}$ | Silver $Bi_{1.8}Pb_{0.4}Ba_{2.2}Co_2O_{9.5}$ (6.25)/ $La_{0.9}Bi_{0.1}NiO_{3.1}$ (6.25) | 90 | 38 |
| 48 | $Ca_{2.7}Bi_{0.3}Co_4O_{9.2}/(La_{0.9}Bi_{0.1})_2NiO_{4.1}$ | Silver $Ca_{2.7}Bi_{0.3}Co_4O_{9.2}$ (6.25)/ $(La_{0.9}Bi_{0.1})_2NiO_{4.1}$ (6.25) | 98 | 27 |
| 49 | $Ca_{2.7}Bi_{0.3}Co_4O_{9.2}/(La_{0.7}Bi_{0.3})_2NiO_{4.4}$ | Silver $Ca_{2.7}Bi_{0.3}Co_4O_9$ (2)/ $(La_{0.7}Bi_{0.3})_2NiO_{4.4}$ (2) | 101 | 30 |
| 50 | $Ca_{3.3}Bi_{0.5}Co_4O_{10}/(La_{0.9}Bi_{0.1})_2NiO_4$ | Silver $Ca_{3.3}Bi_{0.5}Co_4O_{10}/(La_{0.9}Bi_{0.1})_2NiO_4$ | 98 | 32 |

TABLE 4-continued

| Examples (No.) | Thermoelectric material p-type material/n-type material | Metal | Electrically conductive paste Powder for p-type material (parts by weight)/Powder for n-type material (parts by weight) | Open-circuit voltage (mV) | Electrical resistance (mΩ) |
|---|---|---|---|---|---|
| 51 | $Ca_{2.7}Na_{0.3}Co_4O_{8.5}/(La_{0.5}Na_{0.5})_2NiO_{3.8}$ | Silver | $Ca_{2.7}Na_{0.3}Co_4O_{8.5}$ (6.25)/ $(La_{0.5}Na_{0.5})_2NiO_{3.8}$ (6.25) | 92 | 32 |
| 52 | $Ca_{2.7}K_{0.3}Co_4O_{8.4}/(La_{0.5}K_{0.5})_2NiO_{3.6}$ | Silver | $Ca_{2.7}K_{0.3}Co_4O_{8.4}$ (2)/ $(La_{0.5}K_{0.5})_2NiO_{3.6}$ (2) | 93 | 33 |
| 53 | $Ca_{2.7}Li_{0.3}Co_4O_8/(La_{0.5}Sr_{0.5})_2NiO_{3.9}$ | Silver | $Ca_{2.7}Li_{0.3}Co_4O_8$ (6.25)/ $(La_{0.5}Sr_{0.5})_2NiO_{3.9}$ (6.25) | 90 | 35 |
| 54 | $Ca_{2.7}Y_{0.3}Co_4O_{9.3}/(La_{0.9}Bi_{0.1})_2NiO_{4.1}$ | Silver | $Ca_{2.7}Y_{0.3}Co_4O_{9.3}$ (2)/ $(La_{0.9}Bi_{0.1})_2NiO_{4.1}$ (2) | 92 | 29 |
| 55 | $Ca_{2.7}La_{0.3}Co_4O_{9.5}/La_2NiO_{4.1}$ | Silver | $Ca_{2.7}La_{0.3}Co_4O_{9.5}$ (6.25)/ $La_2NiO_{4.1}$ (6.25) | 97 | 31 |
| 56 | $Ca_{2.7}La_{0.3}Co_4O_{9.5}/La_{2.4}NiO_{4.3}$ | Silver | $Ca_{2.7}La_{0.3}Co_4O_{9.5}$ (2)/ $La_{2.4}NiO_{4.3}$ (2) | 95 | 29 |
| 57 | $Ca_{2.7}Ce_{0.3}Co_4O_{9.4}/(La_{0.9}Bi_{0.1})_2NiO_{4.1}$ | Silver | $Ca_{2.7}Ce_{0.3}Co_4O_{9.4}$ (6.25)/ $(La_{0.9}Bi_{0.1})_2NiO_{4.1}$ (6.25) | 92 | 30 |
| 58 | $Ca_{2.7}Pr_{0.3}Co_4O_{9.4}/(La_{0.9}Bi_{0.1})_2NiO_{4.1}$ | Silver | $Ca_{2.7}Pr_{0.3}Co_4O_{9.4}$ (2)/ $(La_{0.9}Bi_{0.1})_2NiO_{4.1}$ (2) | 90 | 31 |
| 59 | $Ca_{2.7}Nd_{0.3}Co_4O_{9.5}/(La_{0.9}Bi_{0.1})_2NiO_{4.1}$ | Silver | $Ca_{2.7}Nd_{0.3}Co_4O_{9.5}$ (6.25)/ $(La_{0.9}Bi_{0.1})_2NiO_{4.1}$ (6.25) | 92 | 27 |
| 60 | $Ca_{2.7}Sm_{0.3}Co_4O_{9.5}/(La_{0.9}Bi_{0.1})_2NiO_{4.1}$ | Silver | $Ca_{2.7}Sm_{0.3}Co_4O_{9.5}$ (2)/ $(La_{0.9}Bi_{0.1})_2NiO_{4.1}$ (2) | 89 | 31 |

TABLE 5

| Examples (No.) | Thermoelectric material p-type material/n-type material | Metal | Electrically conductive paste Powder for p-type material (parts by weight)/Powder for n-type material (parts by weight) | Open-circuit voltage (mV) | Electrical resistance (mΩ) |
|---|---|---|---|---|---|
| 61 | $Ca_{2.7}Eu_{0.3}Co_4O_{9.3}/(La_{0.9}Bi_{0.1})_2NiO_{4.1}$ | Silver | $Ca_{2.7}Eu_{0.3}Co_4O_{9.3}$ (6.25)/ $(La_{0.9}Bi_{0.1})_2NiO_{4.1}$ (6.25) | 88 | 30 |
| 62 | $Ca_{2.7}Gd_{0.3}Co_4O_{9.2}/(La_{0.9}Bi_{0.1})_2NiO_{4.1}$ | Silver | $Ca_{2.7}Gd_{0.3}Co_4O_{9.2}$ (2)/ $(La_{0.9}Bi_{0.1})_2NiO_{9.2}$ (2) | 92 | 29 |
| 63 | $Ca_{2.7}Dy_{0.3}Co_4O_{9.5}/(La_{0.9}Bi_{0.1})_2NiO_{4.1}$ | Silver | $Ca_{2.7}Dy_{0.3}Co_4O_{9.5}$ (6.25)/ $(La_{0.9}Bi_{0.1})_2NiO_{4.1}$ (6.25) | 90 | 31 |
| 64 | $Ca_{2.7}Ho_{0.3}Co_4O_{9.4}/(La_{0.9}Bi_{0.1})_2NiO_{4.1}$ | Silver | $Ca_{2.7}Ho_{0.3}Co_4O_{9.4}$ (2)/ $(La_{0.9}Bi_{0.1})_2NiO_{4.1}$ (2) | 87 | 32 |
| 65 | $Ca_{2.7}Er_{0.3}Co_4O_{9.4}/(La_{0.9}Bi_{0.1})_2NiO_{4.4}$ | Silver | $Ca_{2.7}Er_{0.3}Co_4O_{9.4}$ (6.25)/ $(La_{0.9}Bi_{0.1})_2NiO_{4.4}$ (6.25) | 87 | 34 |
| 66 | $Ca_{2.7}Yb_{0.3}Co_4O_{9.4}/(La_{0.9}Bi_{0.1})_2NiO_{4.1}$ | Silver | $Ca_{2.7}Yb_{0.3}Co_4O_{9.4}$ (2)/ $(La_{0.9}Bi_{0.1})_2NiO_{4.1}$ (2) | 92 | 27 |
| 67 | $Ca_{2.2}Sr_{0.8}Co_4O_{8.8}/(La_{0.8}Sr_{0.2})_2NiO_{3.8}$ | Silver | $Ca_{2.2}Sr_{0.8}Co_4O_{8.8}$ (6.25)/ $(La_{0.8}Sr_{0.2})_2NiO_{3.8}$ (6.25) | 98 | 28 |
| 68 | $Ca_3Co_4O_{9.2}/(La_{0.8}Ca_{0.2})_2NiO_{3.9}$ | Silver | $Ca_3Co_4O_{9.2}$ (2)/ $(La_{0.8}Ca_{0.2})_2NiO_{3.9}$ (1.5) | 95 | 30 |
| 69 | $Ca_{3.6}Co_4O_{9.5}/(La_{0.8}Ca_{0.2})_2NiO_{3.9}$ | Silver | $Ca_{3.6}Co_4O_{9.5}$ (6.25)/ $(La_{0.8}Ca_{0.2})_2NiO_{3.9}$ (6.25) | 92 | 32 |
| 70 | $Ca_{2.2}Bi_{0.4}Na_{0.4}Co_4O_{9.3}/(La_{0.9}Bi_{0.1})_2NiO_{4.1}$ | Silver | $Ca_{2.2}Bi_{0.4}Na_{0.4}Co_4O_{9.3}$ (2)/ $(La_{0.9}Bi_{0.1})_2NiO_{4.1}$ (2) | 97 | 26 |
| 71 | $Ca_{2.2}Y_{0.4}Na_{0.4}Co_4O_{9.2}/(La_{0.9}Bi_{0.1})_2NiO_{4.1}$ | Silver | $Ca_{2.2}Y_{0.4}Na_{0.4}Co_4O_{9.2}$ (2)/ $(La_{0.9}Bi_{0.1})_2NiO_4$ (2) | 91 | 29 |
| 72 | $Ca_{2.2}La_{0.4}Na_{0.4}Co_4O_{9.2}/(La_{0.9}Bi_{0.1})_2NiO_{4.1}$ | Silver | $Ca_{2.2}La_{0.4}Na_{0.4}Co_4O_{9.2}$ (6.25)/ $(La_{0.9}Bi_{0.1})_2NiO_{4.1}$ (6.25) | 90 | 30 |
| 73 | $Ca_{2.2}Ce_{0.4}Na_{0.4}Co_4O_{9.5}/(La_{0.9}Bi_{0.1})_2NiO_{4.1}$ | Silver | $Ca_{2.2}Ce_{0.4}Na_{0.4}Co_4O_{9.5}$ (6)/ $(La_{0.9}Bi_{0.1})_2NiO_4$ (6.25) | 90 | 32 |
| 74 | $Ca_{2.2}Pr_{0.4}Na_{0.4}Co_4O_{9.3}/(La_{0.9}Bi_{0.1})_2NiO_{4.1}$ | Silver | $Ca_{2.2}Pr_{0.4}Na_{0.4}Co_4O_{9.3}$ (2)/ $(La_{0.9}Bi_{0.1})_2NiO_{4.1}$ (1.5) | 89 | 34 |
| 75 | $Ca_{2.2}Nd_{0.4}Na_{0.4}Co_4O_{9.2}/(La_{0.9}Bi_{0.1})_2NiO_{4.1}$ | Silver | $Ca_{2.2}Nd_{0.4}Na_{0.4}Co_4O_{9.2}$ (6.25)/ $(La_{0.9}Bi_{0.1})_2NiO_{4.1}$ (6.25) | 92 | 29 |

TABLE 6

| Examples (No.) | Thermoelectric material p-type material/n-type material | Metal | Electrically conductive paste Powder for p-type material (parts by weight)/Powder for n-type material (parts by weight) | Open-circuit voltage (mV) | Electrical resistance (mΩ) |
|---|---|---|---|---|---|
| 76 | $Ca_{2.2}Sm_{0.4}Na_{0.4}Co_4O_{9.4}/(La_{0.9}Bi_{0.1})_2NiO_{4.1}$ | Silver | $Ca_{2.2}Sm_{0.4}Na_{0.4}Co_4O_{9.4}$ (2)/ $(La_{0.9}Bi_{0.1})_2NiO_{4.1}$ (2) | 93 | 30 |

TABLE 6-continued

| Examples (No.) | Thermoelectric material p-type material/n-type material | Electrically conductive paste Powder for p-type material (parts by weight)/Powder for n-type Metal material (parts by weight) | Open-circuit voltage (mV) | Electrical resistance (mΩ) |
|---|---|---|---|---|
| 77 | $Ca_{2.2}Eu_{0.4}Na_{0.4}Co_4O_{9.2}/(La_{0.9}Bi_{0.1})_2NiO_{4.1}$ | Silver $Ca_{2.2}Eu_{0.4}Na_{0.4}Co_4O_{9.2}$ (6.25)/ $(La_{0.9}Bi_{0.1})_2NiO_{4.1}$ (6.25) | 89 | 27 |
| 78 | $Ca_{2.2}Gd_{0.3}Na_{0.4}Co_4O_{9.4}/(La_{0.9}Bi_{0.1})_2NiO_{4.1}$ | Silver $Ca_{2.2}Gd_{0.3}Na_{0.4}Co_4O_{9.4}$ (2)/ $(La_{0.9}Bi_{0.1})_2NiO_{4.1}$ (1.5) | 89 | 25 |
| 79 | $Ca_{2.2}Dy_{0.4}Na_{0.4}Co_4O_{9.2}/(La_{0.9}Bi_{0.1})_2NiO_{4.1}$ | Silver $Ca_{2.2}Dy_{0.4}Na_{0.4}Co_4O_{9.2}$ (6.25)/ $(La_{0.9}Bi_{0.1})_2NiO_{4.1}$ (6) | 87 | 30 |
| 80 | $Ca_{2.2}Ho_{0.4}Na_{0.4}Co_4O_{9.3}/(La_{0.9}Bi_{0.1})_2NiO_{4.1}$ | Silver $Ca_{2.2}Ho_{0.4}Na_{0.4}Co_4O_{9.3}$ (2)/ $(La_{0.9}Bi_{0.1})_2NiO_{4.1}$ (1.5) | 85 | 32 |
| 81 | $Ca_{2.2}Er_{0.4}Na_{0.4}Co_4O_{9.2}/(La_{0.9}Bi_{0.1})_2NiO_{4.1}$ | Silver $Ca_{2.2}Er_{0.4}Na_{0.4}Co_4O_{9.2}$ (6.25)/ $(La_{0.9}Bi_{0.1})_2NiO_{4.1}$ (6.25) | 87 | 30 |
| 82 | $Ca_{2.2}Yb_{0.4}Na_{0.4}Co_4O_{9.4}/(La_{0.9}Bi_{0.1})_2NiO_{4.1}$ | Silver $Ca_{2.2}Yb_{0.4}Na_{0.4}Co_4O_{9.4}$ (2)/ $(La_{0.9}Bi_{0.1})_2NiO_{4.1}$ (2) | 88 | 29 |
| 83 | $Bi_2Sr_2Co_2O_{9.1}/(La_{0.9}Sr_{0.1})_2NiO_{3.9}$ | Silver $Bi_2Sr_2Co_2O_{9.1}$ (6.25)/ $(La_{0.9}Sr_{0.1})_2NiO_{3.9}$ (6.25) | 97 | 37 |
| 84 | $Bi_{2.2}Sr_{1.8}Co_2O_{8.5}/(La_{0.9}Bi_{0.1})_2NiO_{4.1}$ | Silver $Bi_{2.2}Sr_{1.8}Co_2O_{8.5}$ (6.25)/ $(La_{0.9}Bi_{0.1})_2NiO_{4.1}$ (6.25) | 95 | 42 |
| 85 | $Bi_{1.8}Pb_{0.2}Sr_{1.8}Co_2O_8/(La_{0.5}Na_{0.5})_2NiO_{3.8}$ | Silver $Bi_{1.8}Pb_{0.2}Sr_{1.8}Co_2O_8$ (6.25)/ $(La_{0.5}Na_{0.5})_2NiO_{3.8}$ (6.25) | 94 | 40 |
| 86 | $Bi_{1.8}Pb_{0.4}Sr_{2.2}Co_2O_{9.6}/(La_{0.5}K_{0.5})_2NiO_{3.6}$ | Silver $Bi_{1.8}Pb_{0.4}Sr_{2.2}Co_2O_{9.6}$ (6.25)/ $(La_{0.5}K_{0.5})_2NiO_{3.6}$ (6.25) | 92 | 39 |
| 87 | $Bi_2Ca_2Co_2O_{9.1}/(La_{0.5}Ca_{0.5})_2NiO_{3.7}$ | Silver $Bi_2Ca_2Co_2O_{9.1}$ (6.25)/ $(La_{0.5}Ca_{0.5})_2NiO_{3.7}$ (6.25) | 92 | 43 |
| 88 | $Bi_{2.2}Ca_{1.8}Co_2O_{9.5}/(La_{0.9}Bi_{0.1})_2NiO_{4.1}$ | Silver $Bi_{2.2}Ca_{1.8}Co_2O_{9.5}$ (6.25)/ $(La_{0.9}Bi_{0.1})_2NiO_{4.1}$ (6.25) | 89 | 45 |
| 89 | $Bi_{1.8}Pb_{0.2}Ca_2Co_2O_{8.9}/La_2NiO_{4.1}$ | Silver $Bi_{1.8}Pb_{0.2}Ca_2Co_2O_{8.9}$ (6.25)/ $La_2NiO_{4.1}$ (6.25) | 91 | 42 |
| 90 | $Bi_{1.8}Pb_{0.4}Ca_{2.2}Co_2O_{9.4}/La_{2.4}NiO_{4.3}$ | Silver $Bi_{1.8}Pb_{0.4}Ca_{2.2}Co_2O_{9.4}$ (6.25)/ $La_{2.4}NiO_{4.3}$ (6.25) | 88 | 45 |

TABLE 7

| Examples (No.) | Thermoelectric material p-type material/n-type material | Electrically conductive paste Powder for p-type material (parts by weight)/Powder for n-type Metal material (parts by weight) | Open-circuit voltage (mV) | Electrical resistance (mΩ) |
|---|---|---|---|---|
| 91 | $Bi_2Ba_2Co_2O_9/(La_{0.9}Bi_{0.1})_2NiO_{4.1}$ | Silver $Bi_2Ba_2Co_2O_9$ (6.25)/ $(La_{0.9}Bi_{0.1})_2NiO_{4.1}$ (6.25) | 85 | 40 |
| 92 | $Bi_{2.2}Ba_2Co_2O_{10}/(La_{0.9}Bi_{0.1})_2NiO_4$ | Silver $Bi_{2.2}Ba_2Co_2O_{10}$ (6.25)/ $(La_{0.9}Bi_{0.1})_2NiO_{4.1}$ (6.25) | 88 | 43 |
| 93 | $Bi_{1.8}Pb_{0.2}Ba_2Co_2O_{9.2}/(La_{0.9}Bi_{0.1})_2NiO_{4.1}$ | Silver $Bi_{1.8}Pb_{0.2}Ba_2Co_2O_{9.2}$ (6.25)/ $(La_{0.9}Bi_{0.1})_2NiO_{4.1}$ (6.25) | 90 | 47 |
| 94 | $Bi_{1.8}Pb_{0.4}Ba_{2.2}Co_2O_{9.5}/(La_{0.9}Bi_{0.1})_2NiO_{4.1}$ | Silver $Bi_{1.8}Pb_{0.4}Ba_{2.2}Co_2O_{9.5}$ (6.25)/ $(La_{0.9}Bi_{0.1})_2NiO_{4.1}$ (6.25) | 90 | 50 |

Examples 95 to 106

Oxide powders represented by the formulae shown in Table 8 were used as oxide powders to be mixed in electrically conductive pastes for connecting p-type thermoelectric materials and electrically conductive pastes for connecting n-type thermoelectric materials. These oxide powders were mixed in a commercially-available gold paste (trade name: Au-4460, manufactured by Shoei Chemical Inc.), preparing electrically conductive pastes. The amount of oxide powder in each paste per 100 parts by weight of gold is shown in Table 8. The materials represented by the formulae shown in Table 8 were used as p-type thermoelectric materials and n-type thermoelectric materials.

Used was a gold paste comprising 85% by weight of gold powder (particle diameter of about 0.1 μm to about 5 μm), 1% by weight of borosilicate bismuth glass, 5% by weight of ethyl cellulose, 4% by weight of terpineol, and 5% by weight of butylcarbitol acetate. The amount of oxide powder was 6.25 parts by weight per 100 parts by weight of the silver powder in each gold paste.

Thermoelectric elements were prepared following the procedure of Example 1 except for using the above-mentioned electrically conductive pastes and thermoelectric materials, and thermoelectric performance was evaluated in the same manner as in Example 1.

Table 8 shows open-circuit voltages measured when the temperatures of the high-temperature portion and the low temperature portion were 973K and 500K, respectively, and inner resistances measured when the temperature of the high-temperature portion was 973K. The thermoelectric elements of all of the Examples exhibited more excellent open-circuit voltages and inner resistances as compared with those of thermoelectric elements formed by connecting thermoelectric materials of the same compositions as Examples 95 to 106 with gold paste.

TABLE 8

| Examples (No.) | Thermoelectric material p-type material/n-type material | Metal | Electrically conductive paste Powder for p-type material (parts by weight)/Powder for n-type material (parts by weight) | Open-circuit voltage (mV) | Electrical resistance (mΩ) |
|---|---|---|---|---|---|
| 95 | $Ca_{2.7}Bi_{0.3}Co_4O_{9.2}/La_{0.9}Bi_{0.1}NiO_{3.1}$ | Gold | $Ca_{2.7}Bi_{0.3}Co_4O_{9.2}$ (6.25)/ $La_{0.9}Bi_{0.1}NiO_{3.1}$ (6.25) | 100 | 29 |
| 96 | $Ca_{2.7}Bi_{0.3}Co_4O_{9.2}/La_{0.9}Bi_{0.1}NiO_{3.1}$ | Gold | $Ca_{2.7}Bi_{0.3}Co_4O_{9.2}$ (2.0)/ $La_{0.9}Bi_{0.1}NiO_{3.1}$ (2.0) | 97 | 30 |
| 97 | $Ca_{2.7}Na_{0.3}Co_4O_{8.5}/La_{0.5}Na_{0.5}NiO_{2.7}$ | Gold | $Ca_{2.7}Na_{0.3}Co_4O_{8.5}$ (6.25)/ $La_{0.5}Na_{0.5}NiO_{2.7}$ (6.25) | 98 | 29 |
| 98 | $Bi_2Sr_2Co_2O_{9.1}/La_{0.9}Sr_{0.1}NiO_{3.1}$ | Gold | $Bi_2Sr_2Co_2O_{9.1}$ (6.25)/ $La_{0.9}Bi_{0.1}NiO_3$ (6.25) | 90 | 36 |
| 99 | $Bi_{2.2}Sr_{1.8}Co_2O_{8.5}/La_{0.9}Bi_{0.1}NiO_{3.1}$ | Gold | $Bi_{2.2}Sr_{1.8}Co_2O_{8.5}$ (6.25)/ $La_{0.9}Bi_{0.1}NiO_{3.1}$ (6.25) | 92 | 35 |
| 100 | $Bi_{1.8}Pb_{0.2}Sr_{1.8}Co_2O_8/La_{0.5}Na_{0.5}NiO_{2.7}$ | Gold | $Bi_{1.8}Pb_{0.2}Sr_{1.8}Co_2O_8$ (6.25)/ $La_{0.5}Na_{0.5}NiO_{2.7}$ (6.25) | 92 | 34 |
| 101 | $Ca_{2.7}Bi_{0.3}Co_4O_{9.2}/(La_{0.9}Bi_{0.1})_2NiO_{4.1}$ | Gold | $Ca_{2.7}Bi_{0.3}Co_4O_{9.2}$ (6.25)/ $(La_{0.9}Bi_{0.1})_2NiO_{4.1}$ (6.25) | 98 | 32 |
| 102 | $Ca_{2.7}Bi_{0.3}Co_4O_{9.2}/(La_{0.9}Bi_{0.1})_2NiO_{4.1}$ | Gold | $Ca_{2.7}Bi_{0.3}Co_4O_{9.2}$ (2)/ $(La_{0.9}Bi_{0.1})_2NiO_{4.1}$ (2) | 97 | 34 |
| 103 | $Ca_{2.7}Na_{0.3}Co_4O_{8.5}/(La_{0.5}Na_{0.5})_2NiO_{3.8}$ | Gold | $Ca_{2.7}Na_{0.3}Co_4O_{8.5}$ (6.25)/ $(La_{0.5}Na_{0.5})_2NiO_{3.8}$ (6.25) | 89 | 35 |
| 104 | $Bi_2Sr_2Co_2O_{9.1}/(La_{0.9}Sr_{0.1})_2NiO_{3.9}$ | Gold | $Bi_2Sr_2Co_2O_{9.1}$ (6.25)/ $(La_{0.9}Sr_{0.1})_2NiO_{3.9}$ (6.25) | 87 | 42 |
| 105 | $Bi_{2.2}Sr_{1.8}Co_2O_{8.5}/(La_{0.9}Bi_{0.1})_2NiO_{4.1}$ | Gold | $Bi_{2.2}Sr_{1.8}Co_2O_{8.5}$ (6.25)/ $(La_{0.9}Bi_{0.1})_2NiO_{4.1}$ (6.25) | 86 | 40 |
| 106 | $Bi_{1.8}Pb_{0.2}Sr_{1.8}Co_2O_8/(La_{0.5}Na_{0.5})_2NiO_{3.8}$ | Gold | $Bi_{1.8}Pb_{0.2}Sr_{1.8}Co_2O_8$ (6.25)/ $(La_{0.5}Na_{0.5})_2NiO_{3.8}$ (6.25) | 88 | 39 |

Examples 107 to 121

Oxide powders represented by the formulae shown in Table 9 were used as oxide powders to be mixed in electrically conductive pastes for connecting p-type thermoelectric materials and electrically conductive pastes for connecting n-type thermoelectric materials. These oxide powders were mixed in a commercially-available platinum paste (trade name: D-4001, manufactured by Shoei Chemical Inc.), preparing electrically conductive pastes. The amount of oxide powder in each paste per 100 parts by weight of platinum is shown in Table 9. The materials represented by the formulae shown in Table 9 were used as p-type thermoelectric materials and n-type thermoelectric materials.

Used was a platinum paste comprising 85% by weight of platinum powder (particle diameter of about 0.1 μm to about 5 μm), 1% by weight of borosilicate bismuth glass, 5% by weight of ethyl cellulose, 4% by weight of terpineol, and 5% by weight of butylcarbitol acetate. The amount of oxide powder was 6.25 parts by weight per 100 parts by weight the silver powder in each platinum paste.

Thermoelectric elements were prepared following the procedure of Example 1 except for using the above-mentioned electrically conductive pastes and thermoelectric materials, and thermoelectric performance was evaluated in the same manner as in Example 1.

Table 9 shows open-circuit voltages measured when the temperatures of the high-temperature portion and the low temperature were 973 K and 500 K, respectively, and inner resistances measured when the temperature of the high-temperature portion was 973K. The thermoelectric elements of all of the Examples exhibited excellent open-circuit voltage and inner resistance as compared with those of thermoelectric elements formed by connecting thermoelectric materials of the same compositions as Examples 107 to 121 with platinum paste.

TABLE 9

| Examples (No.) | Thermoelectric material p-type material/n-type material | Metal | Electrically conductive paste Powder for p-type material (parts by weight)/Powder for n-type material (parts by weight) | Open-circuit voltage (mV) | Electrical resistance (mΩ) |
|---|---|---|---|---|---|
| 107 | $Ca_{2.7}Bi_{0.3}Co_4O_{9.2}/La_{0.9}Bi_{0.1}NiO_{3.1}$ | Platinum | $Ca_{2.7}Bi_{0.3}Co_4O_{9.2}$ (6.25)/ $La_{0.9}Bi_{0.1}NiO_{3.1}$ (6.25) | 96 | 32 |
| 108 | $Ca_{2.7}Bi_{0.3}Co_4O_{9.2}/La_{0.9}Bi_{0.1}NiO_{3.1}$ | Platinum | $Ca_{2.7}Bi_{0.3}Co_4O_{9.2}$ (2.0)/ $La_{0.9}Bi_{0.1}NiO_{3.1}$ (2.0) | 87 | 34 |
| 109 | $Ca_{2.7}Na_{0.3}Co_4O_{8.5}/La_{0.5}Na_{0.5}NiO_{2.7}$ | Platinum | $Ca_{2.7}Na_{0.3}Co_4O_{8.5}$ (6.25)/ $La_{0.5}Na_{0.5}NiO_{2.7}$ (6.25) | 85 | 36 |
| 110 | $Bi_2Sr_2Co_2O_{9.1}/La_{0.9}Sr_{0.1}NiO_{3.1}$ | Platinum | $Bi_2Sr_2Co_2O_{9.1}$ (6.25)/ $La_{0.9}Bi_{0.1}NiO_3$ (6.25) | 90 | 42 |
| 111 | $Bi_{2.2}Sr_{1.8}Co_2O_{8.5}/La_{0.9}Bi_{0.1}NiO_{3.1}$ | Platinum | $Bi_{2.2}Sr_{1.8}Co_2O_{8.5}$ (6.25)/ $La_{0.9}Bi_{0.1}NiO_{3.1}$ (6.25) | 91 | 43 |
| 112 | $Bi_{1.8}Pb_{0.2}Sr_{1.8}Co_2O_8/La_{0.5}Na_{0.5}NiO_{2.7}$ | Platinum | $Bi_{1.8}Pb_{0.2}Sr_{1.8}Co_2O_8$ (6.25)/ $La_{0.5}Na_{0.5}NiO_{2.7}$ (6.25) | 89 | 42 |
| 113 | $Ca_{2.7}Bi_{0.3}Co_4O_{9.2}/(La_{0.9}Bi_{0.1})_2NiO_{4.1}$ | Platinum | $Ca_{2.7}Bi_{0.3}Co_4O_{9.2}$ (6.25)/ $(La_{0.9}Bi_{0.1})_2NiO_{4.1}$ (6.25) | 92 | 38 |

TABLE 9-continued

| Examples (No.) | Thermoelectric material p-type material/n-type material | Metal | Electrically conductive paste Powder for p-type material (parts by weight)/Powder for n-type material (parts by weight) | Open-circuit voltage (mV) | Electrical resistance (mΩ) |
|---|---|---|---|---|---|
| 114 | $Ca_{2.7}Bi_{0.3}Co_4O_{9.2}/(La_{0.9}Bi_{0.1})_2NiO_{4.1}$ | Platinum | $Ca_{2.7}Bi_{0.3}Co_4O_{9.2}$ (2)/ $(La_{0.9}Bi_{0.1})_2NiO_{4.1}$ (2) | 90 | 35 |
| 115 | $Ca_{2.7}Na_{0.3}Co_4O_{8.5}/(La_{0.5}Na_{0.5})_2NiO_{3.8}$ | Platinum | $Ca_{2.7}Na_{0.3}Co_4O_{8.5}$ (6.25)/ $(La_{0.5}Na_{0.5})_2NiO_{3.8}$ (6.25) | 88 | 36 |
| 116 | $Bi_2Sr_2Co_2O_{9.1}/(La_{0.9}Sr_{0.1})_2NiO_{3.9}$ | Platinum | $Bi_2Sr_2Co_2O_{9.1}$ (6.25)/ $(La_{0.9}Sr_{0.1})_2NiO_{3.9}$ (6.25) | 87 | 49 |
| 117 | $Bi_{2.2}Sr_{1.8}Co_2O_{8.5}/(La_{0.9}Bi_{0.1})_2NiO_{4.1}$ | Platinum | $Bi_{2.2}Sr_{1.8}Co_2O_{8.5}$ (6.25)/ $(La_{0.9}Bi_{0.1})_2NiO_{4.1}$ (6.25) | 84 | 48 |
| 118 | $Bi_{1.8}Pb_{0.2}Sr_{1.8}Co_2O_8/(La_{0.5}Na_{0.5})_2NiO_{3.8}$ | Platinum | $Bi_{1.8}Pb_{0.2}Sr_{1.8}Co_2O_8$ (6.25)/ $(La_{0.5}Na_{0.5})_2NiO_{3.8}$ (6.25) | 88 | 50 |
| 119 | $Ca_{2.7}Bi_{0.3}Co_4O_{9.2}/La_{0.9}Bi_{0.1}NiO_{3.1}$ | Platinum | $Ca_{2.7}Bi_{0.3}Co_4O_{9.2}$ (6.25)/ $La_{0.9}Bi_{0.1}NiO_{3.1}$ (6.25) | 97 | 25 |
| 120 | $Ca_{2.7}Bi_{0.3}Co_4O_{9.2}/La_{0.9}Bi_{0.1}NiO_{3.1}$ | Platinum | $Ca_{2.7}Bi_{0.3}Co_4O_{9.2}$ (6.25)/ $La_{0.9}Bi_{0.1}NiO_{3.1}$ (6.25) | 98 | 22 |
| 121 | $Ca_{2.7}Sr_2Co_2O_{9.1}/La_{0.9}Bi_{0.1}NiO_{3.1}$ | Platinum | $Ca_{2.7}Sr_2Co_2O_{9.1}$ (6.25)/ $La_{0.9}Bi_{0.1}NiO_{3.1}$ (6.25) | 90 | 34 |

The invention claimed is:

1. An electrically conductive paste for connecting a p-type thermoelectric material made of a complex oxide to an electrically conductive substrate, the electrically conductive paste comprising:
(i) at least one powdery oxide selected from the group consisting of:
  a complex oxide represented by the formula $Ca_aA^1_bCo_cA^2_dO_e$ wherein $A^1$ is one or more elements selected from the group consisting of K, Li, Ti, V, Cr, Mn, Fe, Ni, Cu, Zn, Pb, Sr, Ba, Al, and Bi; $A^2$ is one or more elements selected from the group consisting of Ti, V, Cr, Mn, Fe, Ni, Cu, Mo, W, Nb, and Ta; $2.2 \leq a \leq 3.6$; $0.3 \leq b \leq 0.8$; $2 \leq c \leq 4.5$; $0 \leq d \leq 2$; and $8 \leq e \leq 10$; and
  a complex oxide represented by the formula $Bi_fPb_gM^1_hCo_iM^2_jO_k$ wherein $M^1$ is one or more elements selected from the group consisting of Na, K, Li, Ti, V, Cr, Mn, Fe, Ni, Cu, Zn, Pb, Ca, Ba, Al, Y, and lanthanoids; $M^2$ is one or more elements selected from the group consisting of Ti, V, Cr, Mn, Fe, Ni, Cu, Mo, W, Nb, and Ta; $1.8 \leq f \leq 2.2$; $0 \leq g \leq 0.4$; $1.8 \leq h \leq 2.2$; $1.6 \leq i \leq 2.2$; $0 \leq j \leq 0.5$; and $8 \leq k \leq 10$; and
(ii) at least one powdery electrically conductive metal selected from the group consisting of gold, silver, platinum, and alloys containing at least one of these metals.

2. The electrically conductive paste for connecting a p-type thermoelectric material according to claim 1, wherein the powdery oxide is at least one member selected from the group consisting of:
  a complex oxide represented by the formula $Ca_aA^1_bCo_4O_e$ wherein $A^1$ is one or more elements selected from the group consisting of K, Li, Ti, V, Cr, Mn, Fe, Ni, Cu, Zn, Pb, Sr, Ba, Al, and Bi; $2.2 \leq a \leq 3.6$; $0.3 \leq b \leq 0.8$; and $8 \leq c \leq 10$; and
  a complex oxide represented by the formula $Bi_fPb_gM^1_hCo_2O_k$ wherein $M^1$ is one or more elements selected from the group consisting of Ca, and Ba $1.8 \leq f \leq 2.2$; $0 \leq g \leq 0.4$; $1.8 \leq h \leq 2.2$; and $8 \leq k \leq 10$.

3. The electrically conductive paste for connecting a p-type thermoelectric material according to claim 1, wherein the powdery oxide mentioned in (i) above is contained in an amount of 0.5 to 20 parts by weight per 100 parts by weight of the powdery electrically conductive metal mentioned in (ii) above.

4. The electrically conductive paste for connecting a p-type thermoelectric material according to claim 1, further comprising a glass ingredient and a resin ingredient.

* * * * *